(12) United States Patent
Teng et al.

(10) Patent No.: US 10,304,705 B2
(45) Date of Patent: May 28, 2019

(54) CLEANING DEVICE FOR ATOMIZING AND SPRAYING LIQUID IN TWO-PHASE FLOW

(71) Applicant: BEIJING NAURA MICROELECTRONICS EQUIPMENT CO., LTD., Beijing (CN)

(72) Inventors: Yu Teng, Beijing (CN); Wei Li, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 341 days.

(21) Appl. No.: 15/083,290

(22) Filed: Mar. 29, 2016

(65) Prior Publication Data

US 2017/0170035 A1    Jun. 15, 2017

(30) Foreign Application Priority Data

Dec. 10, 2015    (CN) ..................... 2015 2 1027544 U
Dec. 10, 2015    (CN) ..................... 2015 2 1027568 U
(Continued)

(51) Int. Cl.
*B05B 7/08*        (2006.01)
*H01L 21/67*       (2006.01)
(Continued)

(52) U.S. Cl.
CPC ........ *H01L 21/67051* (2013.01); *B05B 3/085* (2013.01); *B05B 7/045* (2013.01);
(Continued)

(58) Field of Classification Search
CPC ......... B05B 12/22; B05B 15/55; B05B 3/085; B05B 7/045; B05B 13/0278; B05B 7/066;
(Continued)

(56) References Cited

U.S. PATENT DOCUMENTS 4,284,239 A * 8/1981 Ikeuchi ..................... B05B 1/26
                                                    239/419.3
5,549,246 A * 8/1996 Kukesh ..................... B05B 1/14
                                                    239/105
(Continued)

*Primary Examiner* — Joseph L. Perrin
*Assistant Examiner* — Irina Graf
(74) *Attorney, Agent, or Firm* — Tianchen LLC

(57) ABSTRACT

A cleaning device for atomizing and spraying liquid in two-phase flow comprising a nozzle provided with multiple liquid bypass pipelines each having liquid guiding outlets inclined at a predetermined angle and an exhaust mesh plate having vertical gas guiding outlets, which makes the high speed liquid flow and high speed gas flow sprayed out therefrom collide against each other sufficiently to form ultra-micro atomized particles with uniform and adjustable size. The ultra-micro atomized particles are sprayed out downwardly to the wafer surface under the acceleration and vertical orientation effects of an atomized particle guiding outlet to perform a reciprocating cleaning for the wafer. Other components such as an ultrasonic or megasonic generation unit, a gas shielding unit, a self-cleaning unit or a rotating unit can also be provided to perform the multifunction of the nozzle.

3 Claims, 23 Drawing Sheets

(30) Foreign Application Priority Data

Figure 1:
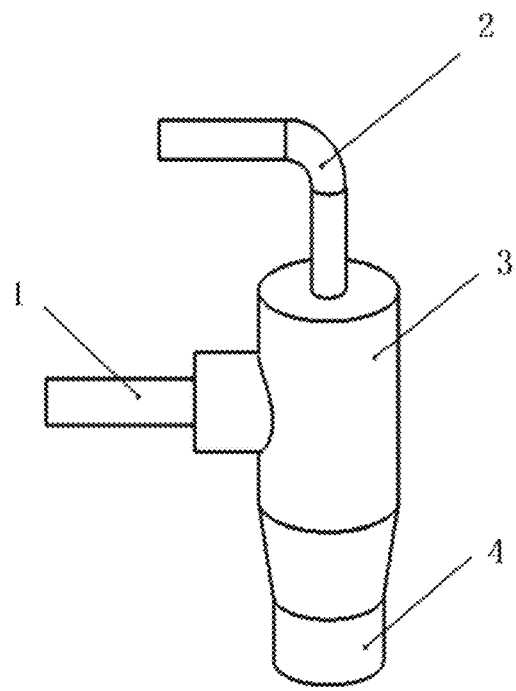

Dec. 10, 2015 (CN) .................... 2015 2 1028612 U
Dec. 10, 2015 (CN) .................... 2015 2 1028786 U

(51) Int. Cl.
- *B05B 15/55* (2018.01)
- *B05B 12/22* (2018.01)
- *B05B 7/04* (2006.01)
- *B05B 3/08* (2006.01)
- *B05B 13/02* (2006.01)
- *B05B 17/06* (2006.01)

(52) U.S. Cl.
CPC ............ *B05B 7/0466* (2013.01); *B05B 12/22* (2018.02); *B05B 13/0278* (2013.01); *B05B 15/55* (2018.02); *B05B 17/0607* (2013.01)

(58) Field of Classification Search
CPC ... B05B 7/0416; B05B 7/0475; B05B 7/0861; B05B 7/0483; B05B 7/061; B05B 7/0892; H01L 21/67051; H01L 21/6708
See application file for complete search history.

(56) References Cited

U.S. PATENT DOCUMENTS

| | | | | |
|---|---|---|---|---|
| 5,692,682 | A * | 12/1997 | Soule | B05B 1/3405 239/403 |
| 5,820,036 | A * | 10/1998 | Saito | B05B 3/1064 239/703 |
| 6,012,647 | A * | 1/2000 | Ruta | B05B 7/066 239/132.1 |
| 6,210,141 | B1 * | 4/2001 | Allen | B05B 7/0861 425/7 |
| 6,378,784 | B1 * | 4/2002 | Allen | B05B 7/0861 239/296 |
| 2002/0092865 | A1 * | 7/2002 | Takagi | B05B 7/0861 222/94 |
| 2003/0178047 | A1 * | 9/2003 | Hirae | B08B 1/04 134/26 |
| 2007/0141849 | A1 * | 6/2007 | Kanno | B01F 3/04049 438/745 |
| 2009/0165828 | A1 * | 7/2009 | Sato | H01L 21/02052 134/102.1 |
| 2009/0283611 | A1 * | 11/2009 | Varanasi | B05B 7/066 239/366 |
| 2010/0116900 | A1 * | 5/2010 | Wurz | F23D 11/102 239/8 |
| 2010/0301129 | A1 * | 12/2010 | Fenton | A61L 2/22 239/10 |
| 2012/0325274 | A1 * | 12/2012 | Kai | H01L 21/67051 134/102.1 |
| 2016/0175861 | A1 * | 6/2016 | Gullicks | B05B 1/3013 239/8 |

* cited by examiner

CLEANING DEVICE FOR ATOMIZING AND SPRAYING LIQUID IN TWO-PHASE FLOW

CROSS-REFERENCE TO RELATED APPLICATION

This application claims the priority benefit of China patent application serial No. 201521027544.3, No. 201521028786.4, No. 201521027568.9, and No. 201521028612.8, filed Dec. 10, 2015. The entirety of each of the above-mentioned patent applications are hereby incorporated by reference herein and made a part of the specifications

FIELD OF THE INVENTION

The present invention relates to the field of semiconductor cleaning technology, and particularly to a cleaning device for atomizing and spraying liquid in two-phase flow.

BACKGROUND OF THE INVENTION

With the rapid development of the semiconductor IC manufacturing technology, the pattern critical dimension of the integrated circuit chips has scaled down to the deep sub micrometer stage, and accordingly the dimension of the main contaminants (such as particles) which will cause the failure or damage to the ultra-fine circuits on the chip also greatly decreases.

In the IC manufacturing process, during multiple processing steps such as a film deposition step, an etch step and a polishing step, etc., which are usually performed to the semiconductor wafers, contaminants are likely produced. In order to maintain the cleanness of the wafer surface and eliminate the contaminants that deposited on the wafer surface during these processing steps, a cleaning process is required to perform to the wafer surface after each of the processing steps. Therefore, the cleaning process has become a most common step in the IC manufacturing for effectively controlling the contamination level of the wafer surface after each processing step, and achieving the purpose of each processing step.

During a conventional single wafer wet cleaning process for removing the contaminants on the wafer surface, the wafer is positioned on a spin susceptor (such as a spin chuck) and rotated at a certain speed, at the same time a certain cleaning solution is sprayed on the wafer surface to performing cleaning.

However, with the critical dimension of the integrated circuit patterns scaling down, it becomes increasingly difficult to remove the contaminants with a smaller size on the wafer surface by using the conventional single wafer wet cleaning process. Therefore, novel cleaning technologies have been widely applied to the conventional single wet cleaning apparatus for further improving the cleaning effect. Atomization is one of such novel cleaning technologies. During the cleaning process, the atomized particles produce an impact force to the liquid membrane on the wafer surface and form a shock wave spreading rapidly in the liquid membrane. The shock wave acts upon the contaminated particles to accelerate peeling the contaminant particles from the wafer surface, as well as to increase the flow speed of the liquid solution on the wafer surface and prompt a faster removal of the contaminant particles from the wafer surface along with the flow of the liquid solution.

However, the atomized particles produced by the current cleaning device have larger size and higher energy, which is prone to cause problems such as the damage to the surface pattern when being applied in the wafer cleaning process under sub-65 nm and beyond technology. On the other hand, the low utilization of the liquid flow in the conventional cleaning device also leads to an extreme waste of resources.

In order to achieve the purpose of minimizing the damage caused by the liquid particles to the sidewalls and edges of the pattern, enhancing the cleaning quality and efficiency and saving the cost, there exists a need for further reducing the size of the sprayed-out liquid particles and better controlling the moving direction, moving speed, moving trajectory as well as the uniformity of the atomized particles.

On the other hand, with the continuous progress of the semiconductor IC manufacturing technology, the size of the semiconductor device is becoming smaller and smaller, as a result, micro particles may be enough to affect the manufacturing process and the performance of the semiconductor device. However, the traditional fluid cleaning method cannot effectively remove these micro particles due to a relatively static boundary layer that formed between the wafer surface and the cleaning liquid. When the diameter of the particles adhered to the wafer surface is smaller than the thickness of the boundary layer, the flow of the cleaning liquid cannot take effect on the particles.

To solve the above problem, ultrasonic or megasonic cleaning is introduced into the semiconductor cleaning process. The ultrasonic or megasonic energy can generate and collapse the tiny air bubbles in the liquid medium. Upon collapse, the air bubbles release energy and cause vibration to form a high speed shock wave in the liquid membrane on the wafer surface, which reduces the thickness of the boundary layer and exposes the contaminant particles in the flowing clean solution, thereby assisting the removal of the micro particles attached to the wafer surface and cleaning the wafer.

Although the ultrasonic or megasonic cleaning process can improve the removing efficiency of the contaminants, the damage to the patterns on the wafer surface still occurs. Specifically, since the ultrasonic or megasonic energy is propagated in the liquid medium through waves, regions of high ultrasonic or megasonic energy density are formed at specific positions where wave superposition is generated and air bubbles have much higher energy when collapsed than the strength of the pattern structures on the wafer surface, which causes the damage to the patterns.

Therefore, there exists a need to improve the uniformity of the ultrasonic or megasonic energy passing on the wafer surface to effectively control the damage to the pattern structures on the wafer surface and enhance the removal efficiency of the contaminant particles attached on the wafer surface.

Furthermore, during the cleaning process using chemical solutions and ultrapure water, materials of the wafer surface are prone to be damaged or reacted with the solutions. For example, during a DHF cleaning process, firstly a DHF solution is injected on the wafer surface through a spray arm to completely remove the native oxide layer formed on the wafer surface. Then ultra-pure water is injected to wash the wafer surface to remove the residual DHF solution and the reaction products. Finally, a nitrogen gas is injected to dry the wafer surface to complete the whole process. However, during the above process, bare silicon on the wafer surface is easy to be reacted with the oxygen in the cleaning chamber to generate silicon dioxide, which changes the materials on the wafer surface and affects the subsequent processes. Accordingly, the oxygen level in the cleaning chamber should be controlled during the process.

Meanwhile, during the above nitrogen gas drying process, watermark defects may appear on the wafer surface if the process condition is not properly controlled. The main mechanism of the watermark formation is that, the residual water formed on the wafer surface due to incomplete drying during the nitrogen gas drying process dissolves the silicon dioxide reacted from oxygen and the silicon element on the wafer surface to further generate $H_2SiO_3$ or $HSiO_3^-$ deposition, thereby creating a flat watermark after the evaporation of the water. Furthermore, during the above cleaning process, water droplets often appear on the wafer edge due to incomplete drying, which also affects the wafer cleaning quality.

Therefore, during the above process, not only the control of the oxygen level in the cleaning chamber, but also the optimization of the drying process is required to achieve a complete drying for the entire wafer surface.

Moreover, in the single wafer wet cleaning apparatus, chemical liquids and ultrapure water are sprayed to the spinning wafer surface by cleaning components such as liquid pipelines or nozzles that are fixed on the spray arm, to achieve the surface cleaning of the wafer. When the time interval between the cleaning processes is long, preflushing of the pipelines is required to keep fresh cleaning liquid filled in the pipelines and ensure consistent cleaning effects of the cleaning processes. Although the preflushing enables replacement of the residual cleaning liquid in the pipeline, it has little effect on the residual cleaning liquid at the outlet of the pipelines or nozzles. Especially, when the cleaning apparatus is kept in a standby state for a long time, some chemical cleaning liquid with high viscosity may be dried to form irregular-shaped particles, which will be transferred to the wafer surface later by the cleaning liquid in the subsequent cleaning process, causing local defects and product yield rate reduction.

Accordingly, there exists a need for improving cleaning the residual chemical liquid at the outlets of the pipelines or nozzles to ensure the consistency of the cleaning effect.

In addition, the regular cleaning process can only remove the contaminants at the center area of the wafer, not that on the wafer edge. The incomplete removal of the contaminants on the wafer edge may at least result in the following two hazards. On one respect, the contaminants on the wafer edge such as metal ions may diffuse into the center area of the wafer and then contaminates the whole wafer, causing a decline in the manufacturing yield rate. On the other respect, the contaminants on the wafer edge may be transferred to other wafers through the clamping pins, the chuck, the FOUP and so on, causing the contamination to other wafers.

Therefore, there also exists a need to regulate the spay direction of the cleaning liquid to clean the wafer edge, so as to improve the chip manufacturing yield rate.

BRIEF SUMMARY OF THE DISCLOSURE

To overcome the problems as mentioned above, it is an object of the present invention to provide a cleaning device for atomizing and spraying liquid in two-phase flow.

According to one aspect of the present invention, a cleaning device for atomizing and spraying liquid in two-phase flow is provided to perform a cleaning process to a wafer positioned on a spin chuck in a cleaning chamber. The cleaning device comprises:

a nozzle including: a liquid pipe inside the nozzle; a gas pipe surrounding the liquid pipe; a liquid-gas guiding part disposed at a lower end of the nozzle and provided with multiple horizontally and symmetrically arranged liquid bypass pipelines which are connected with the liquid pipe; an exhaust mesh plate disposed between the liquid bypass pipelines and connected with the gas pipe; a plurality of gas guiding outlets distributed on the exhaust mesh plate in a vertical direction with respect to the exhaust mesh plate; and a plurality of liquid guiding outlets provided on the liquid bypass pipelines and inclined downward at a predetermined angle with respect to an axis of the nozzle; wherein the liquid guiding outlets and/or the gas guiding outlets are straight tubular shaped, spiral tubular shaped or Laval nozzle structured;

a liquid intake pipeline and a gas intake pipeline, which are both connected to a spray arm and respectively communicated with the liquid pipe and the gas pipe inside the nozzle; wherein the spray arm drives the nozzle to perform an arc-shaped reciprocating motion passing through the center of the wafer;

an atomized particle guiding outlet disposed around and below the liquid-gas guiding part having a Laval nozzle structure or a vertical inner wall;

wherein, a liquid sprayed from the liquid guiding outlets and a gas sprayed from the gas guiding outlets collide against each other below the liquid-gas guiding part to form atomized particles which are then sprayed downward to the wafer surface through the atomized particle guiding outlet to perform a reciprocating two-phase flow cleaning process.

According to the cleaning device mentioned above, with reasonable structure design and proper process parameter adjustment, the cleaning liquid can be atomized into liquid-gas two-phase flow, so as to form ultra-micro atomized particles with uniform sizes. The atomized particles are carried by a carrier gas to be vertically projected onto the wafer surface with the kinetic energy to perform the cleaning process for the wafer. According to the present invention, the damage to the sidewalls and edges of the patterns on the wafer surface can be reduced, the cleaning quality and efficiency can be improved, and the cleaning cost can be saved.

In another aspect of the present invention, a cleaning device for atomizing and spraying liquids in two-phase flow with an ultrasonic or megasonic oscillation means is provided to perform an ultrasonic or megasonic cleaning process to a wafer positioned on a spin chuck in a cleaning chamber. Based on the structure of the above mentioned cleaning device, an ultrasonic or megasonic generation unit is provided along the inner surface of the liquid pipe. The ultrasonic or megasonic generation unit produces ultrasonic or megasonic vibration and applies the ultrasonic or megasonic energy to the flowing cleaning liquid, so as to bring the ultrasonic or megasonic energy to the atomized particles which are formed below the liquid-gas guiding part by the collision of the liquid sprayed from the liquid guiding outlets and the gas sprayed from the gas guiding outlets. The atomized particles with the ultrasonic or megasonic energy are then sprayed downward to the wafer surface under the acceleration or vertical orientation effect of the atomized particle guiding outlet to perform an ultrasonic or megasonic two-phase flow cleaning process for the wafer.

According to the cleaning device having the ultrasonic or megasonic oscillation means mentioned above, a novel nozzle structure is provided to achieve ultrasonic or megasonic cleaning and two-phase flow cleaning at the same time, such that can reduce the damage to the sidewalls and edges of the patterns on the wafer surface, improve the cleaning quality and efficiency and save the cleaning cost.

In another aspect of the present invention, a cleaning device for atomizing and spraying liquids in two-phase flow with a gas shielding means is provided to perform a cleaning and drying process to a wafer positioned on a spin chuck in a cleaning chamber. Based on the cleaning device mentioned in the first aspect of the present invention, a gas shielding unit is provided surrounding the lower end of the nozzle. The gas shielding unit comprises a shielding gas outlet surrounding the atomized particle guiding outlet and inclined outwardly in a downward direction, and a shielding gas inlet communicated with the shielding gas outlet. During the two-phase flow cleaning process, the atomized particles are formed below the liquid-gas guiding part by the collision of the liquid sprayed from the liquid guiding outlets and the gas sprayed from the gas guiding outlets and then sprayed downward to the wafer surface under the acceleration or vertical orientation effect of the atomized particle guiding outlet. Meanwhile, a shielding gas sprayed from the shielding gas outlet at an inclined angle forms a gas shielding layer on the wafer to prevent the oxygen inside the chamber from contacting the wafer. While during the drying process, the liquid intake pipeline is turned off, then a drying gas sprayed from the atomized particle guiding outlet and the shielding gas sprayed from the shielding gas outlet commonly perform a fast drying for the entire wafer surface.

According to the cleaning device with the gas shielding means mentioned above, a new nozzle structure combining the gas shielding function with the two-phase flow cleaning function is provided, which not only effectively reduces the damage to the sidewalls and edges of the patterns on the wafer surface, but also isolates the wafer from the oxygen during the cleaning process and prevents oxidization of the silicon material on the wafer surface, so that can perform drying to the whole wafer surface, prevent the watermark defects and improve the cleaning quality and efficiency.

In another aspect of the present invention, a cleaning device for atomizing and spraying liquids in two-phase flow with a self-cleaning means is provided to clean a wafer positioned on a spin chuck in a cleaning chamber as well as itself. Based on the cleaning device mentioned in the first aspect of the present invention, a self-cleaning unit is provided surrounding the lower end of the nozzle. The self-cleaning unit comprises a cleaning medium outlet surrounding the atomized particle guiding outlet and inclined inwardly in a downward direction, and a cleaning medium inlet communicated with the cleaning medium outlet. During the cleaning process, a gas is sprayed out from the cleaning medium outlet at an inclined angle to perform an online cleaning to the lower end of the atomized particle guiding outlet, which prevents large condensed droplets of the cleaning liquid forming on the side wall of the atomized particle guiding outlet and then dropping onto the wafer surface. After the cleaning process, the nozzle is driven by the spray arm back to its initial position, a gas or a liquid or an atomized mixture thereof is sprayed from the cleaning medium outlet to perform an offline cleaning to the lower end of the atomized particle guiding outlet.

According to the cleaning device with the self-cleaning means mentioned above, a new nozzle structure combining the self-cleaning function with the two-phase flow cleaning function is provided, which not only effectively reduces the damage to the sidewalls and edges of the patterns on the wafer surface, but also ensures an in-time cleaning for the nozzle both during and after the cleaning process, thereby improving the cleaning quality and efficiency and saving the cleaning cost.

In another aspect of the present invention, a cleaning device for atomizing and spraying liquids in two-phase flow that permits the adjustment of the spray direction is provided to perform a cleaning process to a wafer not only in a vertical spray direction, but also in an inclined spray direction to rinse the peripheral edge of the wafer. Based on the cleaning device mentioned in the first aspect of the present invention, a rotating unit matched with the nozzle is provided outside the nozzle to make the nozzle rotate relative to the rotating unit to clean the peripheral edge of the wafer. Furthermore, a vertical shielding cover is provided outside the nozzle on one side along the rotating direction to resist the splashed cleaning liquid.

According to the cleaning device that permits the adjustment of the spray direction mentioned above, the rotating unit matched with the nozzle is designed to enable the nozzle to clean toward the peripheral edge of the wafer, to effectively remove the contaminants on the peripheral edge of the wafer and improve the yield rate of the chip manufacturing. Furthermore, the shielding cover is also provided to resist the splashed cleaning liquid, thereby preventing the center area of the wafer being polluted again.

The advantages of the present invention are described as follows:

1. With the nozzle structure having the liquid guiding outlets and the gas guiding outlets which enable a sufficient collision of the high speed liquid and the high speed gas sprayed out therefrom, and further with the flow control of the pipelines of the nozzle, ultra-micro atomized particles having uniform and adjustable size can be formed. Since the size and the energy of the atomized particles are greatly reduced, the damage to the pattern structures on the wafer surface can be prevented. Furthermore, the atomized particle guiding outlet can be a Laval nozzle structure to spray out the atomized particles with higher speed while keeping the flow of the gas intake pipeline and the flow of the liquid intake pipeline constant, thereby improving the cleaning efficiency.

2. In the case where the atomized particle guiding outlet has an vertical inner wall, the atomized flow can be sprayed out in a direction vertical to the wafer surface under the vertical orientation effect of the atomized particle guiding outlet during the cleaning process, which promotes the transmission of the contaminants within the trenches of the patterns on the wafer surface into the cleaning liquid fluid, improves the cleaning quality and efficiency, reduces the transverse shear force of the atomized particles to the patterns on the wafer surface and avoids the damage to the patterns.

3. During the cleaning process, a cleaning liquid with high flow can be sprayed from a mass flow liquid pipe to pre-form a cleaning liquid membrane on the wafer surface before the injection of the atomized particles with uniform adjustable size and small mass to rinse the wafer surface. Therefore, the impact force from the atomized particles to the patterns of the wafer surface can be reduced, and the damage to the patterns can be decreased. Furthermore, the atomized particles hitting against the cleaning liquid membrane forms a shock wave which on one hand acts on the contaminated particles to speed up the peeling of the contaminants from the wafer surface, on the other hand accelerates the flow of the cleaning liquid on the wafer surface to promote the rapid removal of the contaminants from the wafer surface along with the cleaning liquid flow.

4. The liquid-gas guiding part with spiral-shaped liquid/gas guiding outlets can improve the atomization efficiency of the cleaning liquid, reduce the diameter of the atomized particles, and improve the uniformity of the atomized particles; while the liquid-gas guiding part with Laval-nozzle structured liquid/gas guiding outlets can increase the speed of the liquid/gas sprayed therefrom.

5. The shape of the nozzle can be a sector, a triangle, a polygon or a bar to enhance the coverage area of the nozzle, that is, to increase the area cleaned by the nozzle at one time, thereby improving the cleaning uniformity and the cleaning efficiency.

6. A gas separating plate can be provided in the gas intake pipeline to achieve a uniform gas flow distribution, and improve the size and amount distribution uniformity of the atomized particles.

7. The cleaning liquid with the ultrasonic or megasonic energy can be atomized by the cleaning device to form the atomized particles. Since these atomized particles are randomly distributed into the cleaning liquid membrane on the wafer surface both in time and in space, the ultrasonic or megasonic energy carried by the atomized particles will not generate a stable energy interference field. In other words, the uniformity of the ultrasonic or megasonic energy applied to the wafer surface is improved, so as to effectively suppress the damage to the patterns on the wafer surface.

8. Compared with the conventional cleaning device, the cleaning device of the present invention with the ultrasonic or megasonic oscillation means can spray the atomized particles with ultrasonic or megasonic energy into the cleaning liquid membrane on the wafer surface. Accordingly, in addition that the atomized particles injected to the wafer surface with the kinetic energy forms a shock wave in the liquid membrane, the ultrasonic or megasonic energy is also carried into the liquid membrane by the atomized particles to form a shock wave due to the collapse of cavitation bubbles or a straight flow, thus to improve the efficiency of removing the contaminants on the wafer surface, shorten the process time, save the usage of the cleaning liquid and the high-purity gas, reduce the production cost, and decrease the influence for the environment.

9. In the two-phase flow cleaning process, a shielding gas can be sprayed out from the shielding gas outlet at an inclined angle and forms a gas shielding layer above the wafer, which prevents the reaction between the silicon element on the wafer surface and the oxygen in the cleaning chamber. In the drying process, the liquid intake pipeline can be turned off while keeping the gas intake pipeline and the shielding gas outlet both opened to replace the conventional single spray arm which injects a drying gas individually, so as to perform a rapid drying process to the entire wafer surface including the center area and the peripheral edge and simplify the structure of the cleaning chamber.

Figure 39:
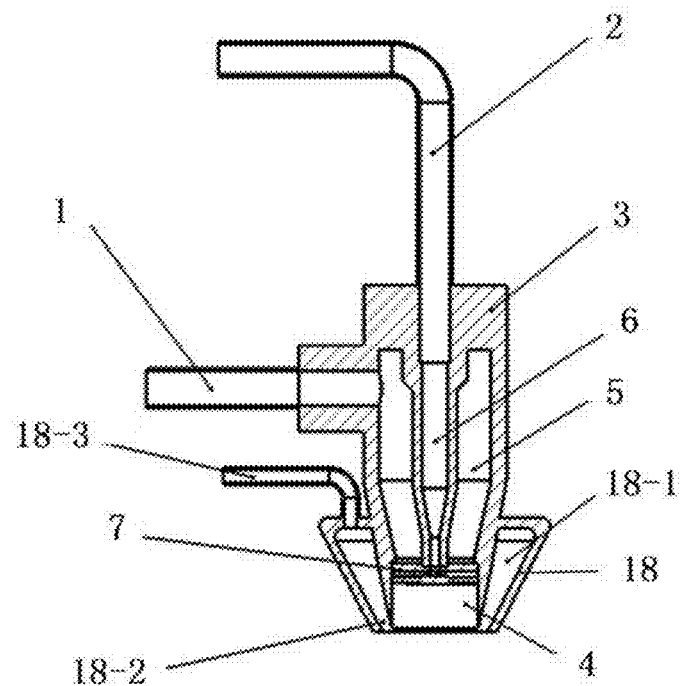
Figure 40:
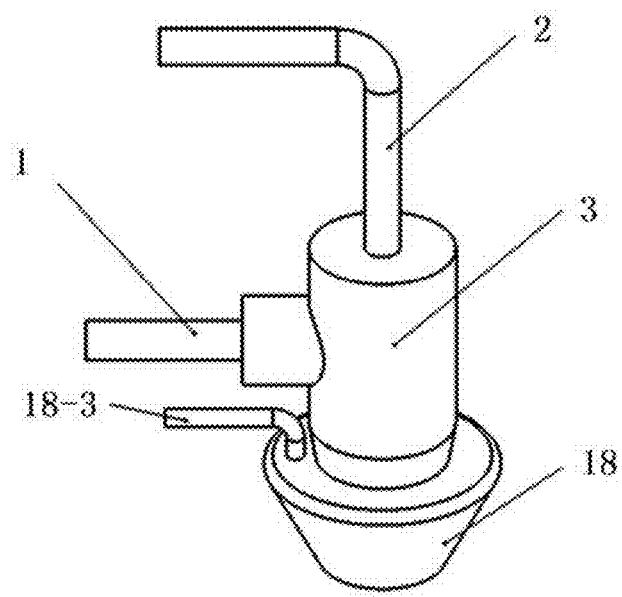
Figure 41:
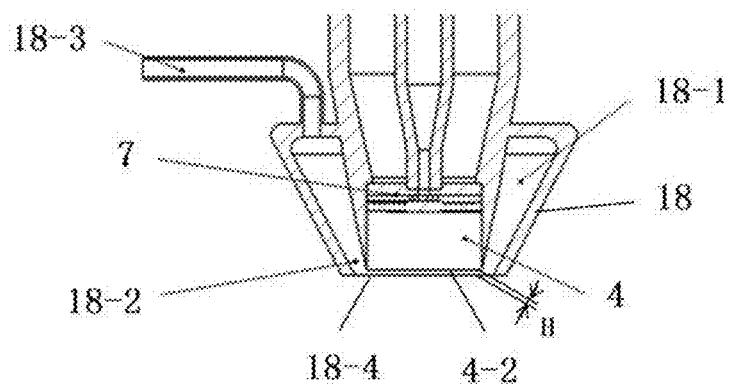
Figure 42:
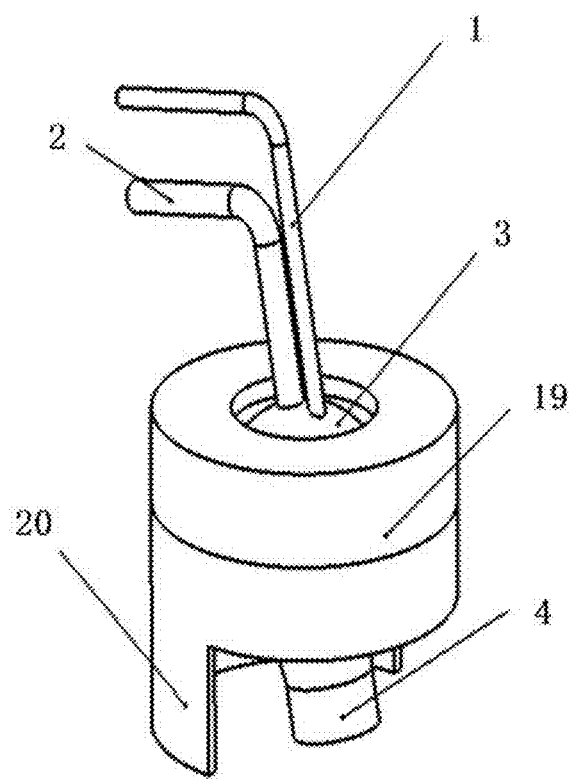
Figure 43:
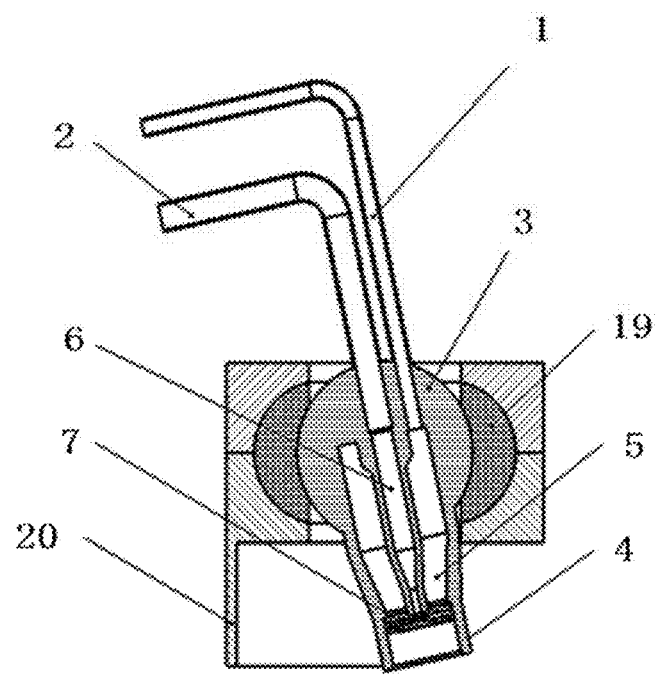
Figure 44:
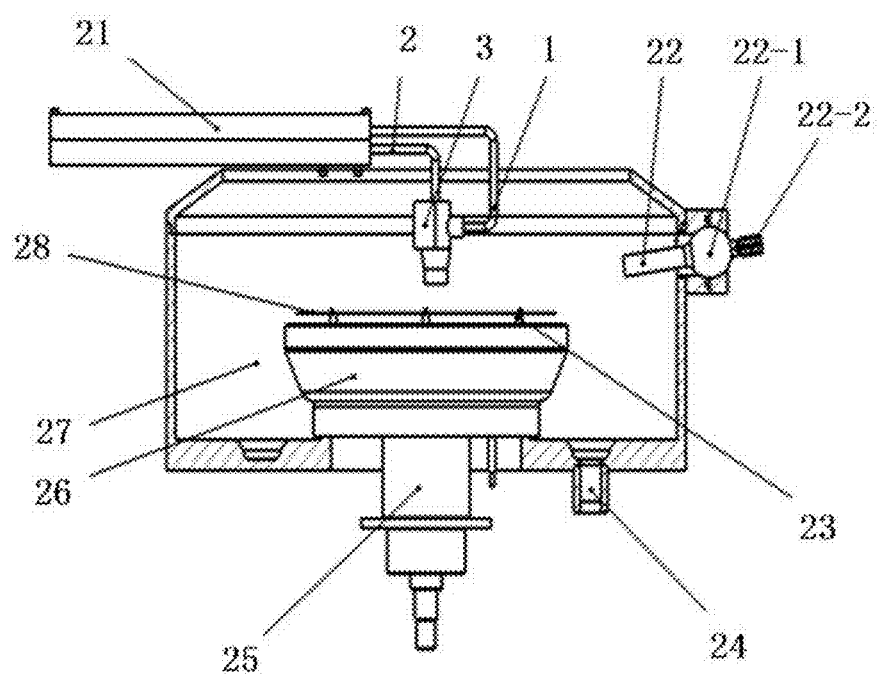
Figure 45:
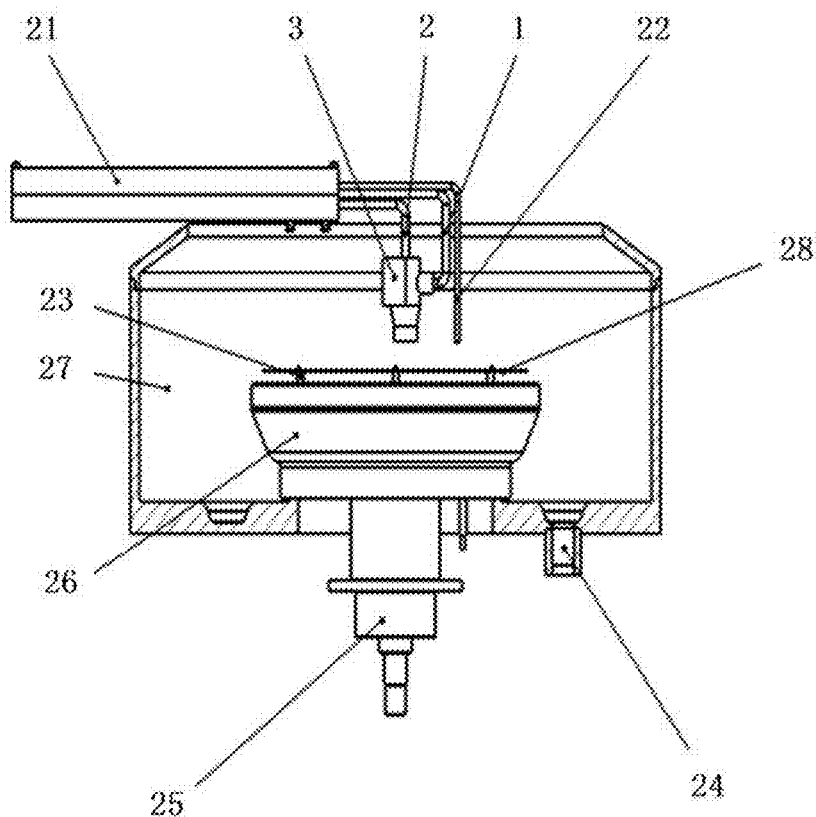
Figure 46:
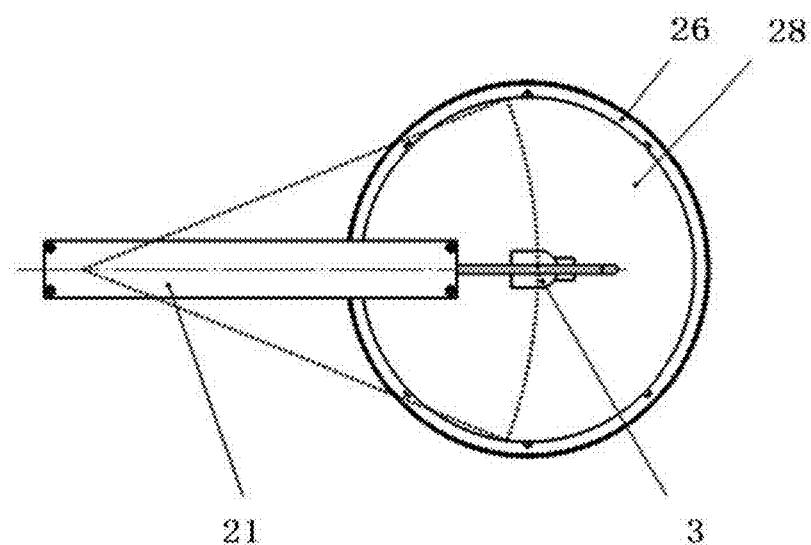

10. In the two-phase flow cleaning process, a gas as the cleaning medium can be introduced into a cleaning medium buffer chamber through the cleaning medium inlet and achieve a uniform pressure distribution along the circumferential direction after passing through the cleaning medium buffer chamber. Then the gas can be sprayed out from the cleaning medium outlet toward the interior of the atomized particle guiding outlet at an inclined angle. Therefore, in addition to perform an online cleaning of the nozzle, the high speed cleaning medium of gas can also assist to bring the cleaning liquid flowed downward along the side wall of the atomized particle guiding outlet back to a position right below the outlet of the nozzle to be atomized again by the atomized particles, which prevents large condensed droplets of the cleaning liquid forming on the side wall of the atomized particle guiding outlet and then dropping onto the wafer surface to cause the problems such as defects on the wafer surface or non-uniform cleaning. After the two-phase flow cleaning process, the spray arm can be moved back to its initial position, away from above the wafer, and then the cleaning medium inlet can be turned on for introducing a gas or a liquid or their atomized mixture to perform an offline cleaning for the lower end of the atomized particle guiding outlet. Accordingly, the formation of the condensed droplets of the remaining cleaning liquid at the atomized particle guiding outlet can be prevented, which provides a necessary preparation for the next cleaning process. Therefore, by employing the self-cleaning unit, the present invention can ensure an in-time cleaning for the nozzle both during and after the cleaning process.

11. The rotating unit and the shielding cover can be provided outside the nozzle, which not only enables the nozzle to be inclined with respect to the wafer surface toward a direction away from the center of the wafer to perform cleaning to the peripheral edge of the wafer and effectively remove the contaminants on the peripheral edge, but also prevents the secondary pollution caused by the splash of the cleaning liquid.

BRIEF DESCRIPTION OF THE DRAWINGS

FIGS. 1~2 are schematic views illustrating a cleaning device for atomizing and spraying liquid in two-phase flow having a round-shaped nozzle according to a preferred embodiment of the present invention;

FIGS. 3~8 are schematic views illustrating different structures of the nozzle compared with the nozzle shown in FIG. 2;

FIGS. 9~14 are fragmentary enlarged schematic views illustrating different structures of the gas-liquid guiding part compared with the one shown in FIG. 2;

FIGS. 15~17 are schematic views illustrating a cleaning device having a triangle-shaped nozzle according to a preferred embodiment of the present invention;

FIGS. 18~21 are schematic views illustrating a cleaning device having a sector-shaped nozzle according to a preferred embodiment of the present invention;

FIGS. 22~23 are schematic views illustrating a cleaning device having a pentagonal-shaped nozzle according to a preferred embodiment of the present invention;

FIGS. 24~25 are schematic views illustrating a cleaning device having a bar-shaped nozzle according to a preferred embodiment of the present invention;

FIG. 26 is a graph illustrating the non-uniform flow field distribution inside the gas intake pipe of the nozzle;

FIGS. 27~32 are schematic views illustrating a cleaning device having a gas separating plate according to a preferred embodiment of the present invention;

FIG. 33 is a schematic view illustrating a cleaning device having an ultrasonic or megasonic generation unit according to a preferred embodiment of the present invention;

FIG. 34 is a fragmentary enlarged schematic view of the ultrasonic or megasonic generation unit shown in FIG. 33;

FIG. 35 is a schematic view illustrating a cleaning device having an ultrasonic or megasonic generation unit according to another preferred embodiment of the present invention;

FIG. 36 is a fragmentary enlarged schematic view of the ultrasonic or megasonic generation unit shown in FIG. 35;

FIG. 37 is a schematic view illustrating a cleaning device having a gas shielding unit according to a preferred embodiment of the present invention;

FIG. 38 is an outline schematic view of the cleaning device shown in FIG. 37;

FIG. 39 is a schematic view illustrating a cleaning device having a self-cleaning unit according to a preferred embodiment of the present invention;

FIG. 40 is an outline schematic view of the cleaning device shown in FIG. 39;

FIG. 41 is an enlarged schematic view of the self-cleaning unit shown in FIG. 39;

FIGS. 42~43 are schematic views illustrating a cleaning device having a spray direction adjustment means according to a preferred embodiment of the present invention;

FIGS. 44~45 are schematic views illustrating the cleaning device positioned in the cleaning chamber according to a preferred embodiment of the present invention;

FIG. 46 is a schematic view illustrating the moving trajectory of the spray arm during the cleaning process.

DETAILED DESCRIPTION OF THE EMBODIMENTS

The present invention will be described in further details hereinafter by referring to the accompanying drawings, so as to provide a better understanding of the present invention.

It should be noted that, in the following specific embodiments, when these embodiments of the present invention are described in detail, in order to clearly illustrate the structure of the present invention to facilitate explanation, the accompanying drawings are not necessarily drawn to scale, some features in the drawings may have been fragmentary enlarged, deformed or simplified. Therefore, it should be avoided to understand this as a limitation to the present invention.

Figure 2:
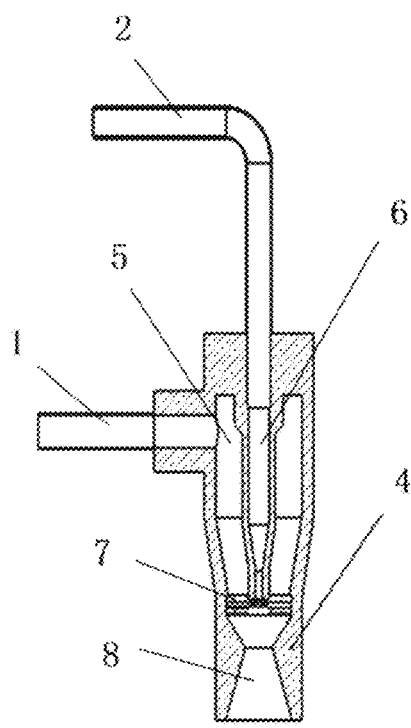

Referring to FIGS. 1~2, which are schematic views illustrating a cleaning device for atomizing and spraying liquid in two-phase flow having a round-shaped nozzle according to a preferred embodiment of the present invention. As shown in FIG. 1, which discloses an outline structure of the cleaning device according to the present embodiment, the cleaning device of the present invention comprises a nozzle 3, a liquid intake pipeline 2, a gas intake pipeline 1, and an atomized particle guiding outlet 4. Wherein, the cross section shape of the nozzle 3 can be round, triangle, polygon, fan-shaped, or bar-shaped. In the embodiment, a round-shaped nozzle is taken as an example to illustrate the cleaning device for atomizing and spraying liquid in two-phase flow in detail.

As shown in FIG. 2, which illustrates an interior structure of the cleaning device in the FIG. 1, the nozzle 3 comprises inside a liquid pipe 6 and a gas pipe 5 surrounding the liquid pipe 6. The liquid intake pipeline 2 and the gas intake pipeline 1 are respectively communicated with the liquid pipe 6 and the gas pipe 5 for introducing a cleaning liquid and a cleaning gas. A liquid-gas guiding part 7 is disposed at the lower end of the nozzle, that is, below the liquid pipe 6 and the gas pipe 5, for guiding and atomizing the cleaning liquid in the liquid pipe and the cleaning gas in the gas pipe. The atomized particle guiding outlet 4 is disposed around and below the liquid-gas guiding part 7 for spraying the atomized particles downward to the wafer surface. The atomized particle guiding outlet 4 can have a Laval nozzle structure 8 as shown in FIG. 2, or a vertical inner wall structure (shown in FIG. 7).

In order to increase the spray speed of the atomized particles at the outlet of the cleaning device, the structure of the atomized particle guiding outlet is optimized to have a Laval nozzle structure. As a result, the atomized particles can be sprayed from the outlet of the cleaning device with higher speed while maintaining a constant flow in each of the gas intake pipeline and the liquid intake pipeline, thereby improving the cleaning efficiency. As shown in FIG. 2, the Laval nozzle structure 8 comprises a convergent portion, a narrow throat, and a divergent portion from top to bottom.

The atomized particle guiding outlet 4 is designed to have the Laval nozzle structure 8 based on the Laval principle, so that can spray the atomized particles with higher speed to improve the cleaning efficiency and save the cleaning liquid and gas consumption.

Figure 3:
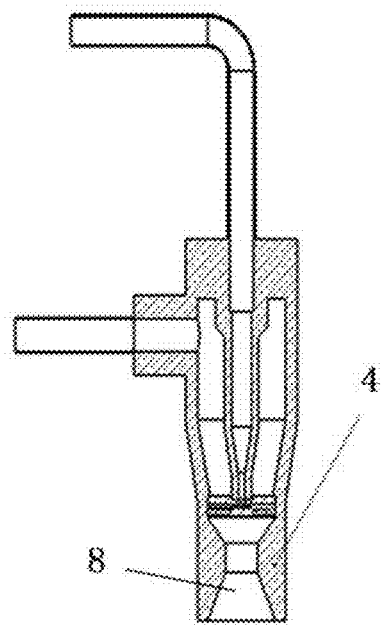
Figure 4:
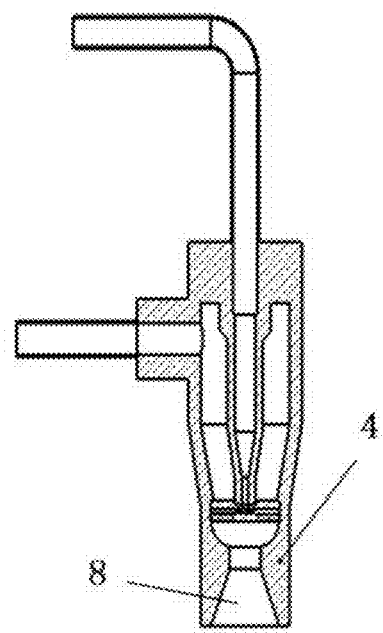
Figure 5:
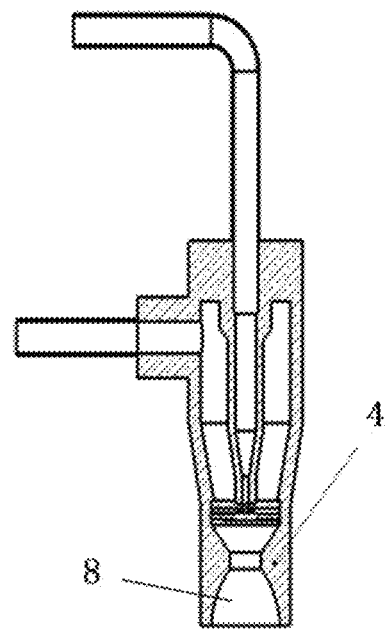
Figure 6:
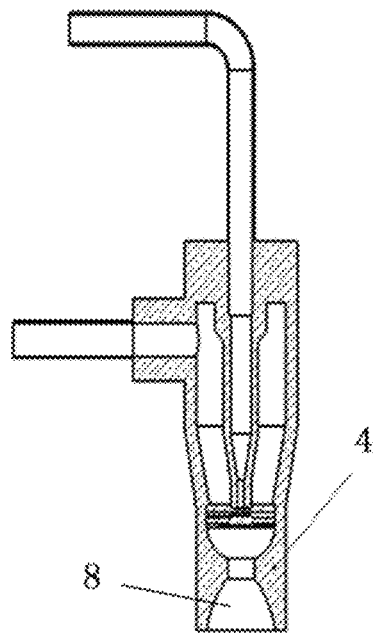

Referring now to FIGS. 3~8, which are schematic views showing different structures of the nozzle. As shown in FIG. 3, in an alternative embodiment, the narrow throat of the Laval nozzle structure 8 is designed to have a fixed dimension, that is, a transition portion with fixed dimension provided between the cone of the convergent portion and the cone of the divergent portion. In accordance with such configuration, most of the gas is sprayed out vertically to the wafer surface after passing through the narrow throat due to the restriction of the narrow throat.

As shown in FIGS. 3~6, in other different embodiments, one or both of the convergent portion and the divergent portion can have a straight or curved sidewall in vertical section. That is, the convergent portion and/or the divergent portion can be a cone-shaped tube or a bowl-like structure to properly adjust the speed and direction of the passing flow.

Figure 7:
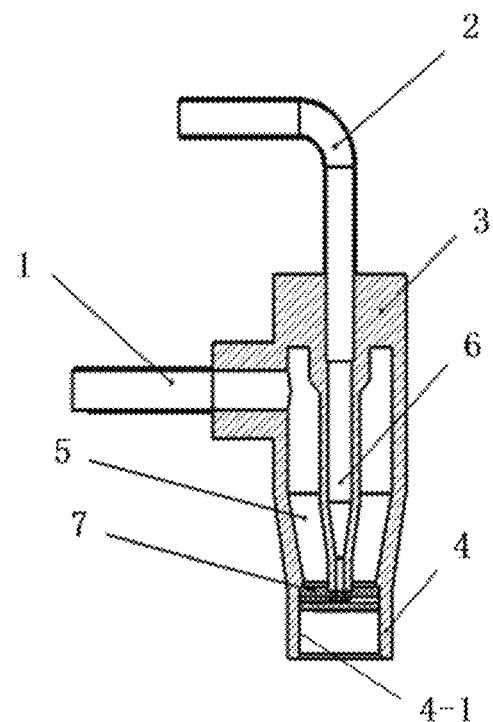

As shown in FIG. 7, in another embodiment, the atomized particle guiding outlet 4 has a vertical inner wall 4-1 for providing a vertical guidance to the atomized particles which are moved in a direction non-parallel to the vertical axis of the nozzle 3 and struck at the inner wall 4-1 of the atomized particle guiding outlet 4, so as to ensure a vertical movement of all the atomized particles arriving at the liquid membrane on the wafer surface and prevent the damage to the pattern structures on the wafer surface due to the horizontal shear force.

Figure 8:
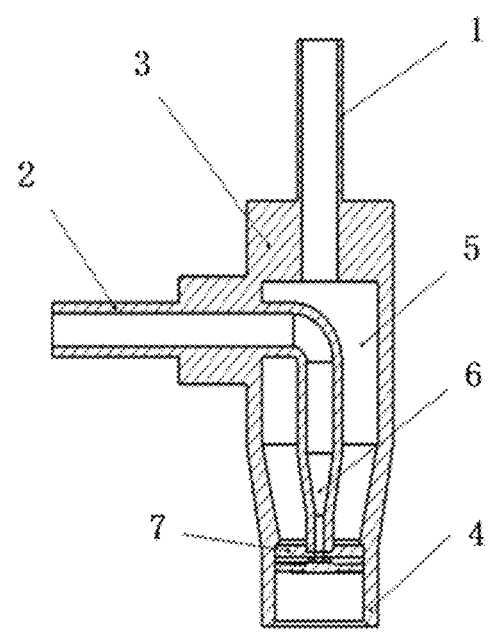

As shown in FIGS. 1~6, the liquid intake pipeline 2 is introduced into the nozzle 3 to be communicated with the liquid pipe 6 from the center area of the upper end surface of the nozzle 3, the gas intake pipeline 1 is introduced into the nozzle 3 to be communicated with the gas pipe 5 from the upper side wall of the nozzle 3. On the contrary, as shown in FIG. 8, the liquid intake pipeline 2 is introduced into the nozzle 3 to be communicated with the liquid pipe 6 from the upper side wall of the nozzle 3 (in this case, the liquid intake pipeline 2 is communicated with the sidewall of the upper end of the liquid pipe 6 by penetrating into the nozzle 3 and passing over the gas pipe 5), and the gas intake pipeline 1 is introduced into the nozzle 3 to be communicated with the gas pipe 5 from the center area of the upper end surface of the nozzle 3. The inlets of the liquid intake pipeline and the gas intake pipeline can be formed at different positions on the nozzle, other connection ways can also be adopted, which is not limited thereto.

Figure 9:
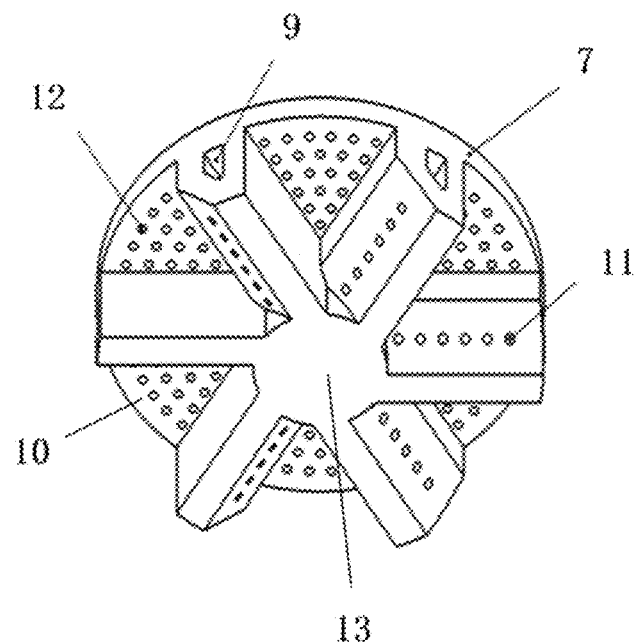

Referring now to FIGS. 9~14, which are enlarged schematic views of different structures of the gas-liquid guiding part shown in FIG. 2. Taking a nozzle with a round-shaped cross section as an example, as shown in FIG. 9, the gas-liquid guiding part 7 is provided with multiple liquid bypass pipelines 9 communicated with the liquid pipe 6, which are distributed in a symmetry arrangement. For example, in the embodiment, the multiple liquid bypass pipelines 9 of the gas-liquid guiding part are commonly connected at the lower end 13 of the liquid pipe and arranged uniformly in a form of spokes. Between the liquid bypass pipelines 9, an exhaust mesh plate 10 connected with the gas pipe is provided. For example, in the embodiment, the portion of the exhaust mesh plate between each two adjacent liquid bypass pipelines has a sector shape. The exhaust mesh plate is provided with multiple densely distributed gas guiding outlets 12 formed in a direction vertical to the exhaust mesh plate, and each liquid bypass pipeline 9 is provided with multiple liquid guiding outlets 11 formed along its length and inclined downwardly at a predetermined angle with respect to the vertical axis of the nozzle. For example, in the embodiment, the liquid guiding outlets 11 on each liquid bypass pipelines are disposed below the exhaust mesh plate 10 and inclined in a downward direction toward the exhaust mesh plate on the same side (the left side in FIG. 9). In the actual manufacturing for the liquid guiding outlets, the lower end of each liquid bypass pipeline 9 is firstly processed to form an end surface inclined downward at an angle (complementary angle of the predetermined angle) with respect to the vertical axis of the nozzle, then the liquid guiding outlets can be formed on the end surface in a direction vertical to the end surface. Alternatively, the predetermined angle ranges from 10° to 80° to achieve a better atomization effect. Preferably, the predetermined angle ranges from 30° to 60° to achieve a much better atomization effect. The multiple liquid bypass pipelines can also be disposed in other proper symmetry arrangements, such as a fishbone arrangement, a concentric circle arrangement, etc., as long as the liquid guiding outlets are formed toward the gas guiding outlets on the same side at a predetermined angle.

Figure 10:
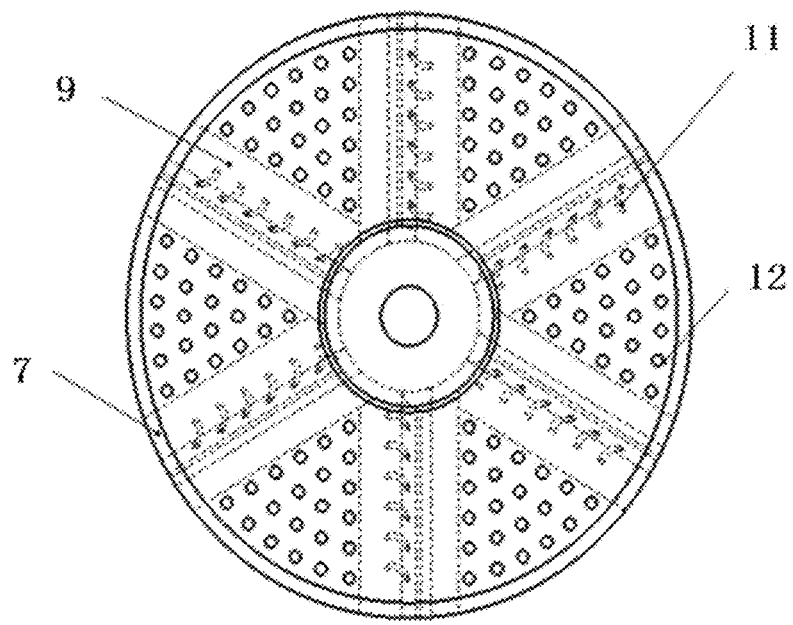

The liquid guiding outlets 11 and/or the gas guiding outlets 12 can be straight tubular shaped, spiral tubular shaped or Laval-nozzle structured. In order to improve the atomizing efficiency of the cleaning liquid, decrease the diameter of the atomized particles and enhance the size uniformity of the atomized particles, the liquid guiding outlets and/or the gas guiding outlets within the gas-liquid guiding part 7 are designed to be spiral tubular shaped. FIG. 10 shows a top view of the gas-liquid guiding part with the spiral tubular shaped liquid guiding outlets. When sprayed out from the liquid guiding outlets 11 at a certain speed, the cleaning liquid spontaneously forms a thin layer under the orientation effect of the spiral structure and the inertia force, which increases the interaction area with the gas sprayed out from the gas guiding outlets 12, such that can form microscale or nanoscale atomized particles with uniform size more effectively, improve the cleaning efficiency, and reduce the pattern damages.

Figure 11:
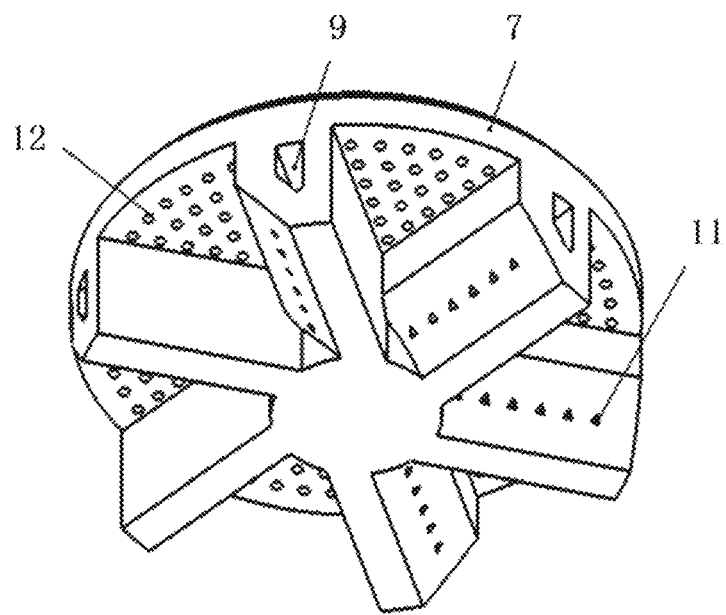
Figure 12:
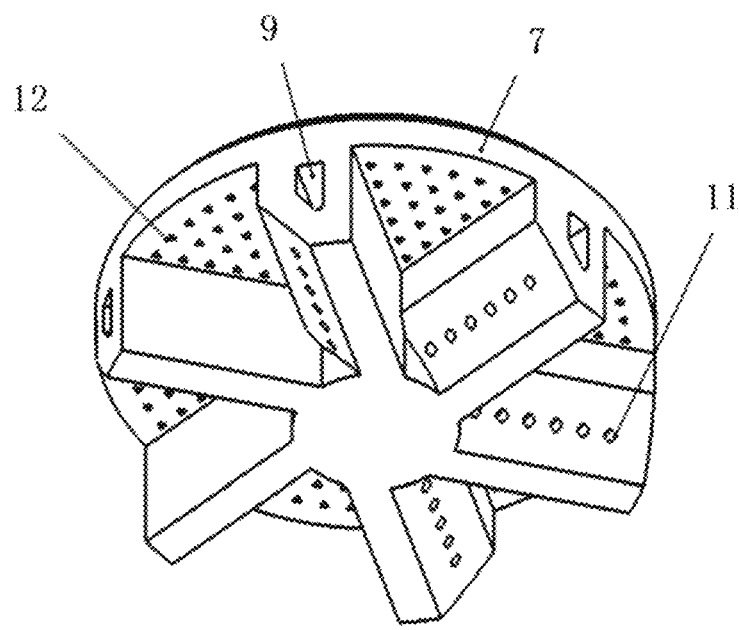
Figure 13:
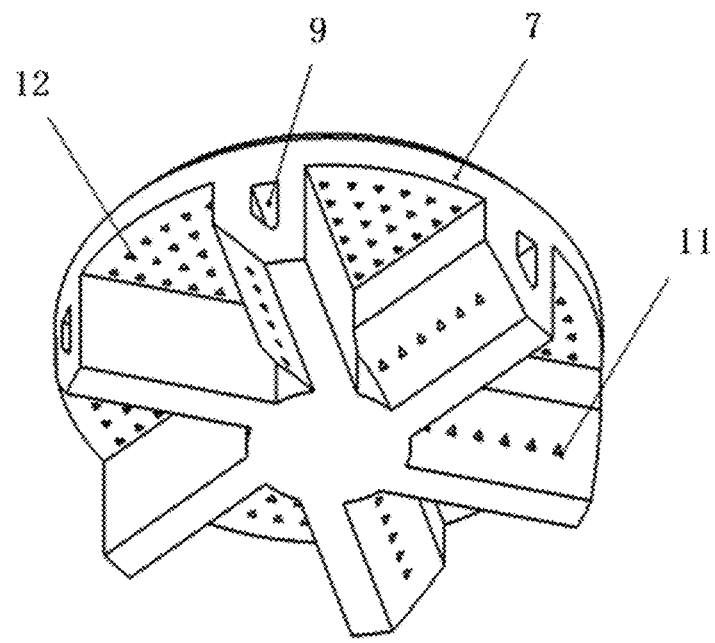

When the liquid guiding outlets 11 and/or the gas guiding outlets 12 are straight tubular shaped or spiral tubular shaped, the cross section thereof can be round, triangle, or polygon. FIG. 9 shows a schematic view of the gas-liquid guiding part 7 having round liquid guiding outlets 11 and round gas guiding outlets 12. FIG. 11 shows a schematic view of the gas-liquid guiding part 7 having triangle liquid guiding outlets 11 and round gas guiding outlets 12. FIG. 12 shows a schematic view of the gas-liquid guiding part 7 having round liquid guiding outlets 11 and triangle gas guiding outlets 12. FIG. 13 shows a schematic view of the gas-liquid guiding part 7 having triangle liquid guiding outlets 11 and triangle gas guiding outlets 12.

Alternatively, the diameter of the round cross section of the liquid guiding outlets 11 and/or gas guiding outlets 12, or the height of the triangle or polygon cross section of the liquid guiding outlets 11 and/or gas guiding outlet 12 can be in a range from 1 μm to 1000 μm, preferably in a range from 200 μm to 400 μm.

Figure 14:
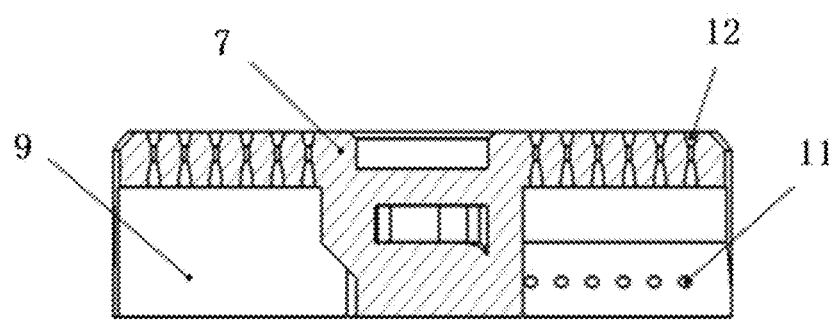

As shown in FIG. 14, in a preferred embodiment, the gas guiding outlets 12 and/or the liquid guiding outlets 11 can be designed to have a Laval nozzle structure to spray the gas and/or liquid with higher speed. In the embodiment, the gas guiding outlets 12 are processed to have the Laval nozzle structure. In addition, the Laval nozzle structure can have a throat with a fixed diameter, a convergent portion and a divergent portion each having a cone-shaped or bowl-shaped section (referring to FIGS. 3 to 6 for further understanding).

In order to improve the cleaning efficiency of the present invention, the shape of the nozzle is optimized to increase the coverage area of the nozzle. Wherein, the cross section of the nozzle can be triangle, sector, polygon or bar-shaped.

Figure 15:
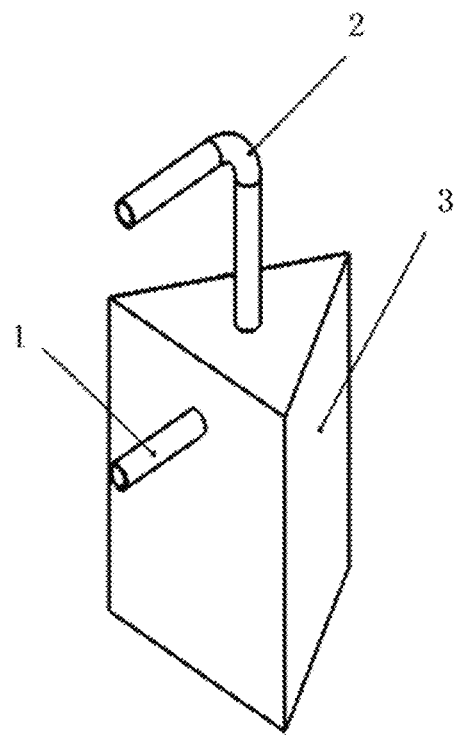
Figure 16:
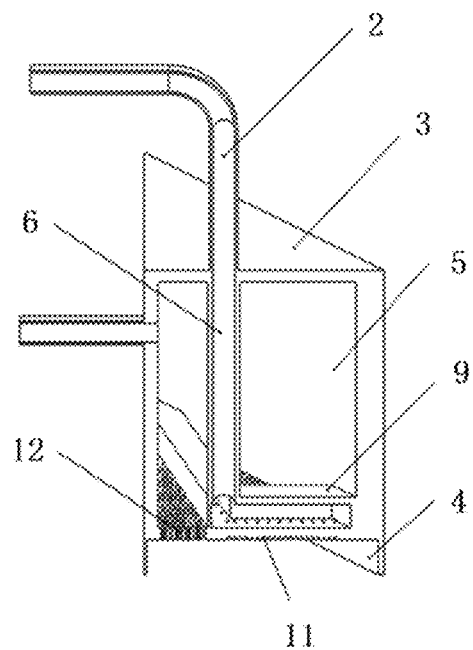
Figure 17:
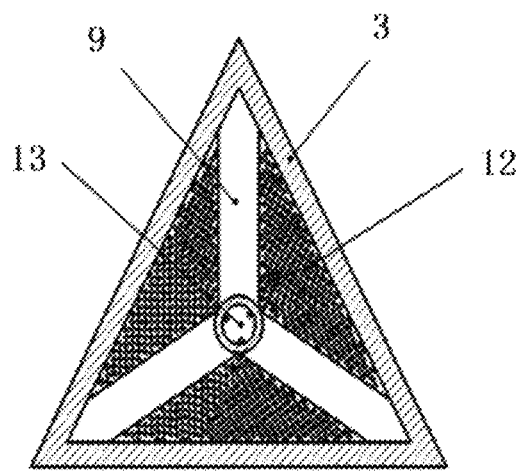

Referring now to FIGS. 15~17, which are schematic views illustrating a cleaning device having a triangle nozzle in a preferred embodiment of the present invention. As shown in FIG. 15, the nozzle 3 has an outline structure of a triangle cylinder, the liquid intake pipeline 2 is disposed at the center area of the upper end surface of the triangle cylinder, and the gas intake pipeline 1 is disposed on the upper sidewall of the triangle cylinder. FIG. 16 shows a vertical sectional view of the nozzle in which the gas pipe 5 has a triangle internal structure identical to the nozzle 3. The atomized particle guiding outlet 4 is disposed below the liquid bypass pipelines 9, and has a vertical inner wall coinciding with the triangle profile of the nozzle 3. Along each liquid bypass pipeline 9, one or two lines of liquid guiding outlets 11 are disposed and inclined toward one or two sides of the liquid bypass pipeline in a downward direction at a predetermined angle between 10~80° with respect to the vertical axis of the nozzle 3. As shown in FIG. 17, three liquid bypass pipelines 9 are commonly connected to the liquid pipe at the lower end 13 of the liquid pipe, and respectively fixed at three vertices of the triangle cylinder of the nozzle 3 to form a symmetry arrangement. An exhaust mesh plate is disposed between the liquid bypass pipelines 9, on which a plurality of densely distributed gas guiding outlets 12 are manufactured. In the embodiment, the atomized particle guiding outlet can also have a Laval nozzle structure.

Figure 18:
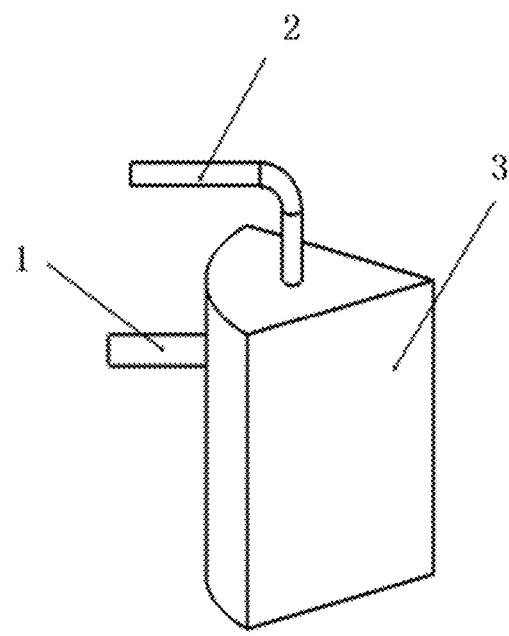
Figure 19:
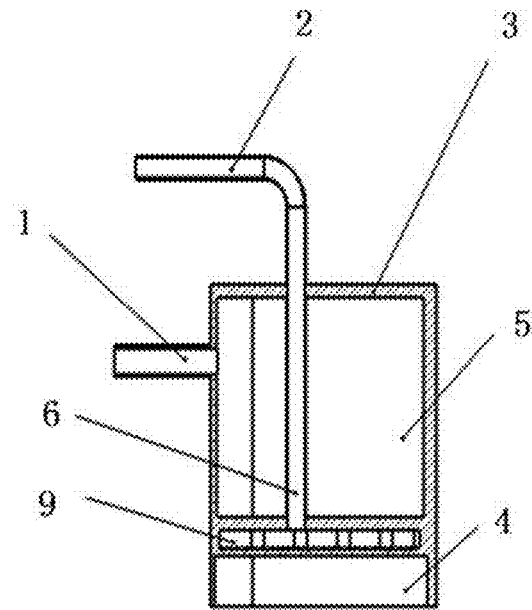
Figure 20:
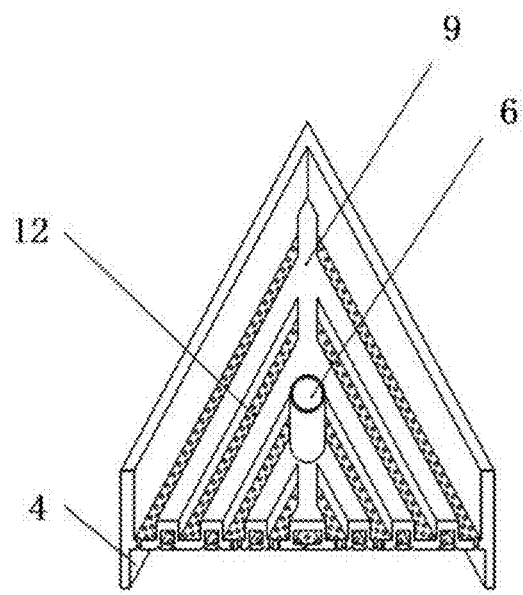
Figure 21:
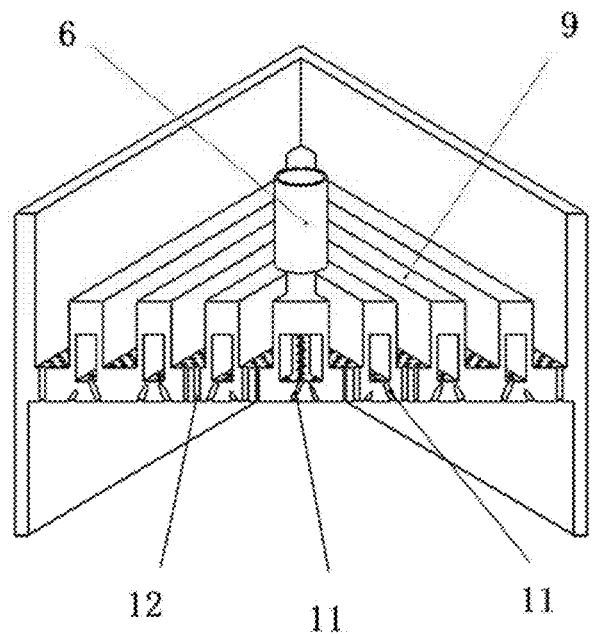

Referring now to FIGS. 18~21, which are schematic views illustrating a cleaning device having a fan-shaped nozzle in a preferred embodiment of the present invention. As shown in FIG. 18, the nozzle 3 has an outline structure of a sector cylinder, the liquid intake pipeline 2 is disposed at the center area of the upper end surface of the sector cylinder, and the gas intake pipeline 1 is disposed at the upper area of the curved sidewall. FIG. 19 shows a vertical sectional view of the nozzle, in which the gas pipe 5 has a fan-shaped internal structure identical to the nozzle 3. The atomized particle guiding outlet 4 is disposed below the liquid bypass pipelines 9, and has a vertical inner wall coinciding with the sector profile of the nozzle 3. FIG. 20 schematically illustrates seven liquid bypass pipelines 9 of the gas-liquid guiding part, in which the middle liquid bypass pipeline coincident with the symmetric axis of the sector is taken as the main bypass pipeline and communicated with the lower end of the liquid pipe 6, other six liquid bypass pipelines are arranged symmetrically on both sides of the middle liquid bypass pipeline and parallel to the radii of the sector on the same side. In the regions with no liquid bypass pipelines 9, the exhaust mesh plate is formed with a plurality of densely distributed gas guiding outlets 12 manufactured thereon. As shown in FIG. 21, along each liquid bypass pipeline 9, two lines of the liquid guiding outlets 11 are disposed and respectively inclined in a downward direction at a predetermined angle between 10~80° with respect to the vertical axis of the nozzle 3 toward the right and left sides as indicated in FIG. 21. The cleaning device with fan-shaped nozzle has the advantages of enlarging the spray area of the nozzle, which is the area to be cleaned by the nozzle at one time, to a sector region covering the wafer center and the wafer edge, enhancing the cleaning efficiency and improving the cleaning uniformity. The atomized particle guiding outlet of the present embodiment can also have the Laval nozzle structure.

Figure 22:
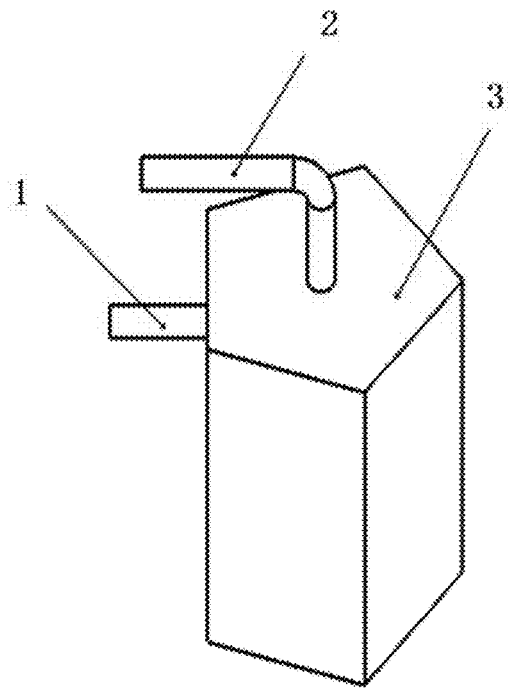
Figure 23:
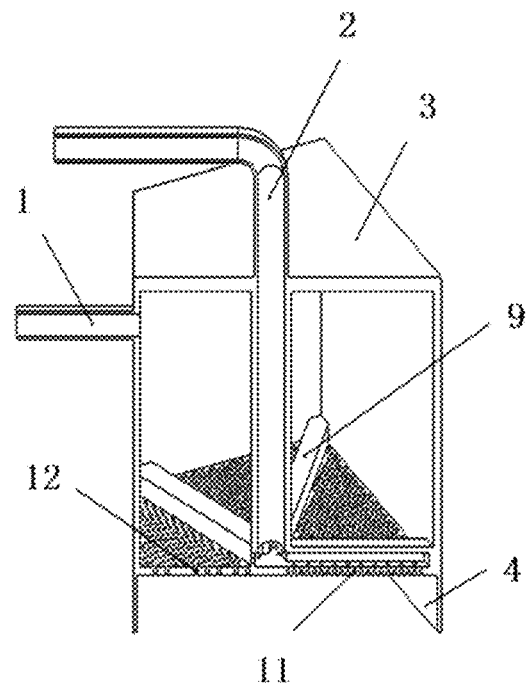

Referring now to FIGS. 22~23, which are schematic views showing a cleaning device having a pentagonal nozzle in a preferred embodiment of the present invention. As shown in FIG. 22, the nozzle 3 has an outline structure of a pentagon cylinder, the liquid intake pipeline 2 is disposed at the center area of the upper end surface of the pentagon cylinder, and the gas intake pipeline 1 is disposed on the upper area of one sidewall of the pentagon cylinder. FIG. 23 shows a vertical sectional view of the nozzle, in which the atomized particle guiding outlet 4 is disposed below the liquid bypass pipelines 9 and has a vertical inner wall coinciding with the pentagon profile of the nozzle 3. Five liquid bypass pipelines 9 are commonly connected to the liquid pipe at the lower end of the liquid pipe, and respectively fixed at five vertices of the pentagon cylinder of the nozzle 3 to form a symmetry arrangement. Along each liquid bypass pipeline 9, a plurality of liquid guiding outlets 11 are disposed and inclined toward one side in a downward direction at a predetermined angle such as 10~80° with respect to the vertical axis of the nozzle 3. Between the liquid bypass pipelines 9, the exhaust mesh plate is formed with a plurality of densely distributed gas guiding outlets 12 manufactured thereon. The atomized particle guiding outlet of the present embodiment can also have the Laval nozzle structure.

Figure 24:
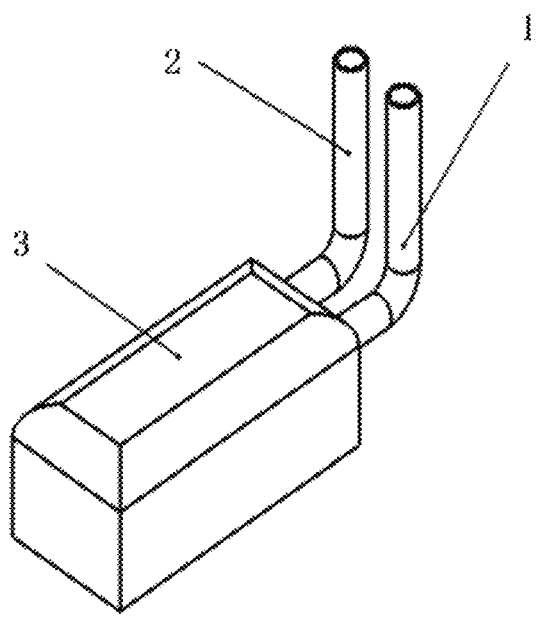
Figure 25:
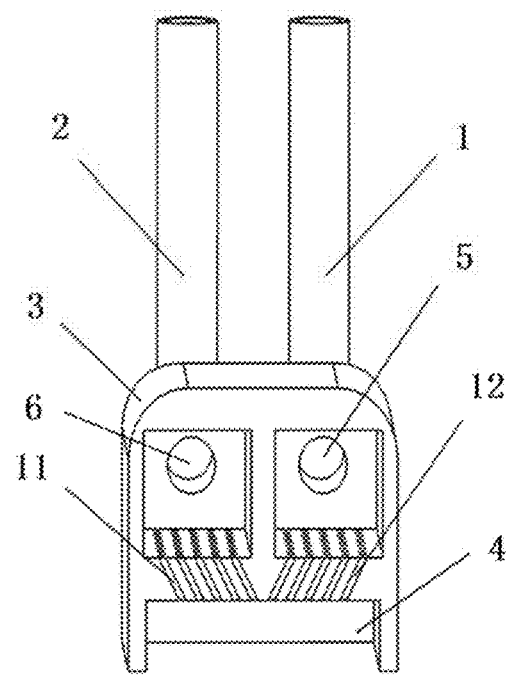

Referring now to FIGS. 24~25, which are schematic views showing a cleaning device having a bar-shaped nozzle in a preferred embodiment of the present invention. As shown in FIG. 24, the nozzle 3 has an outline structure of a horizontal cuboid, both the liquid intake pipeline 2 and the gas intake pipeline 1 are introduced into the nozzle from one end surface, and respectively communicated with the liquid pipe and the gas pipe within the nozzle. FIG. 25 shows a vertical sectional view of the nozzle, in which the liquid pipe 6 and the gas pipe 5 are arranged in parallel along the long side direction. At the bottom of the liquid pipe 6, multiple columns (e.g., five columns as shown in the figure) of liquid guiding outlets 11 communicated with the liquid pipe are provided in parallel along the long side direction of the horizontal cuboid. Similarly, at the bottom of the gas pipe 5, multiple columns (e.g., five columns as shown in the figure) of gas guiding outlets 12 communicated with the gas pipe are provided in parallel along the long side direction. The liquid guiding outlets 11 and the gas guiding outlets 12 are symmetrically arranged on both sides of the horizontal axis of the nozzle 3 at a predetermined inclined angle such as 10~80° with respect to the horizontal axis of the nozzle 3 in a downward direction, so that the sprayed cleaning liquid and gas can collide against each other to form the ultra-micro atomized particles. Actually, the present embodiment provides a different structure which combines the liquid bypass pipelines of the gas-liquid guiding part with the liquid guiding outlets together, and combines the exhaust mesh plate with the gas guiding outlets together. The atomized particle guiding outlet 4 is disposed around and below the liquid guiding outlets 11 and the gas guiding outlets 12, and has a vertical inner wall coinciding with the rectangle profile of the nozzle 3. The atomized particle guiding outlet of the present embodiment can also have the Laval nozzle structure.

Figure 26:
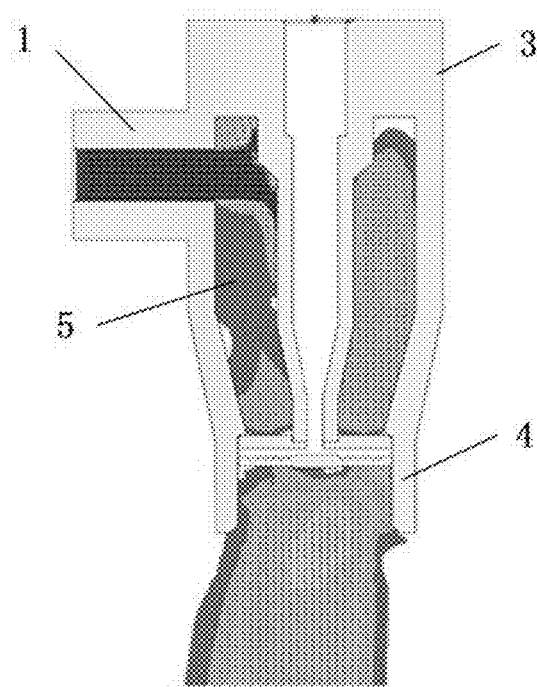

FIG. 26 illustrates the non-uniform distribution of the flow field in the gas pipe of the nozzle. As shown in FIG. 26, when the gas intake pipeline 1 is introduced into the nozzle from the upper sidewall of the nozzle 3 (e.g. the upper area of the left sidewall as shown in the FIG. 26) to be communicated with the gas pipe 5, the gas fed into the gas pipe forms a non-uniform flow field in a way that more gas is distributed in the region away from the gas inlet while less gas is distributed in the region near the gas inlet. This causes a non-uniform distribution of the atomized particles formed at the atomized particle guiding outlet 4 in size, quality and space (represented in different shades to show the difference).

Figure 27:
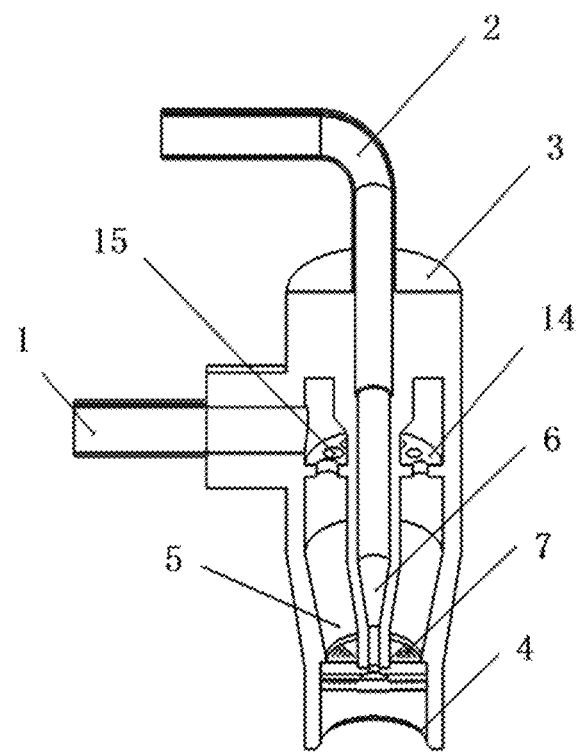
Figure 28:
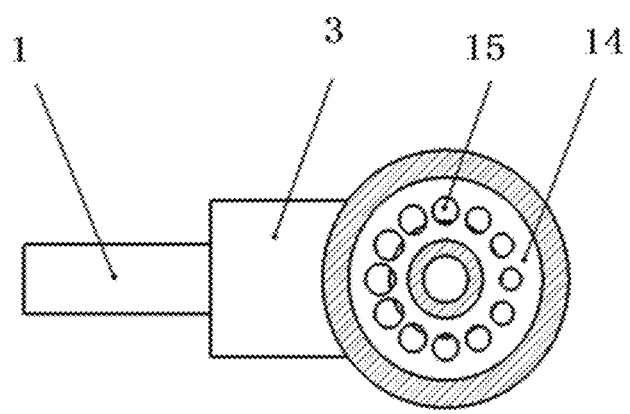

FIGS. 27~32 are schematic views illustrating a cleaning device having a gas separating plate in a preferred embodiment of the present invention. As shown in FIG. 27, in order to improve the uniformity of the gas flow field in the gas pipe of the nozzle, a gas separating plate 14 is horizontally disposed in the gas pipe below the gas inlet and around the liquid pipe, on which a series of through holes 15 with different sizes surrounding the liquid pipe 6 are manufactured. In addition, as shown in FIG. 28, the diameters of the through holes 15 (round holes as shown in the figure) decrease gradually along the direction away from the gas inlet of the gas pipe.

Figure 29:
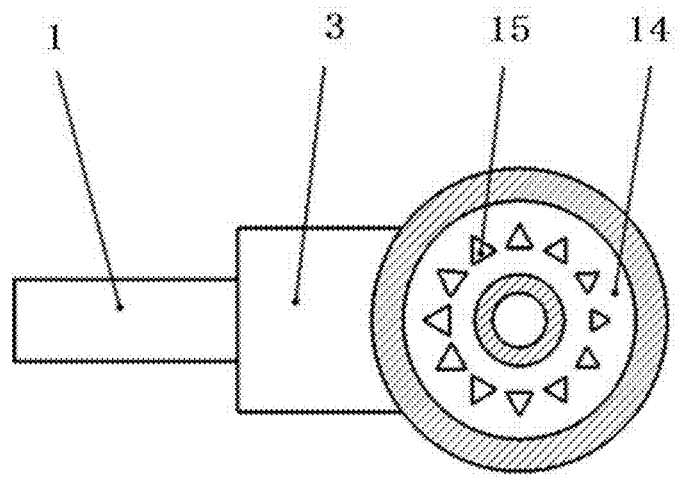
Figure 30:
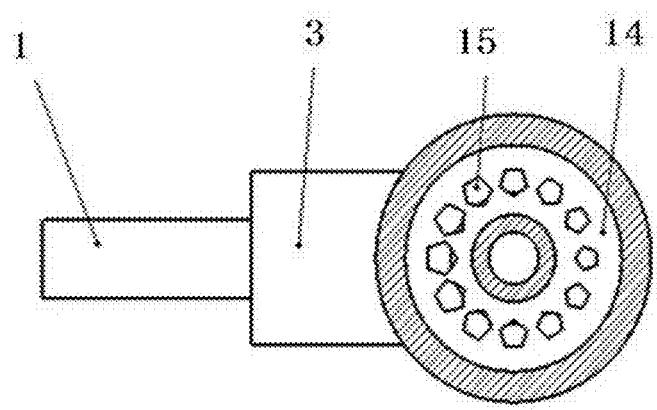

Referring now to FIGS. 28~30, the shape of the through holes 15 on the gas separating plate 14 can be round, triangle, or polygon. As shown in FIG. 28, the through holes are round in shape with decreasing diameters; as shown in FIG. 29, the through holes are triangle in shape with decreasing sizes; and as shown in FIG. 30, the through holes are pentagon in shape with decreasing sizes.

Figure 31:
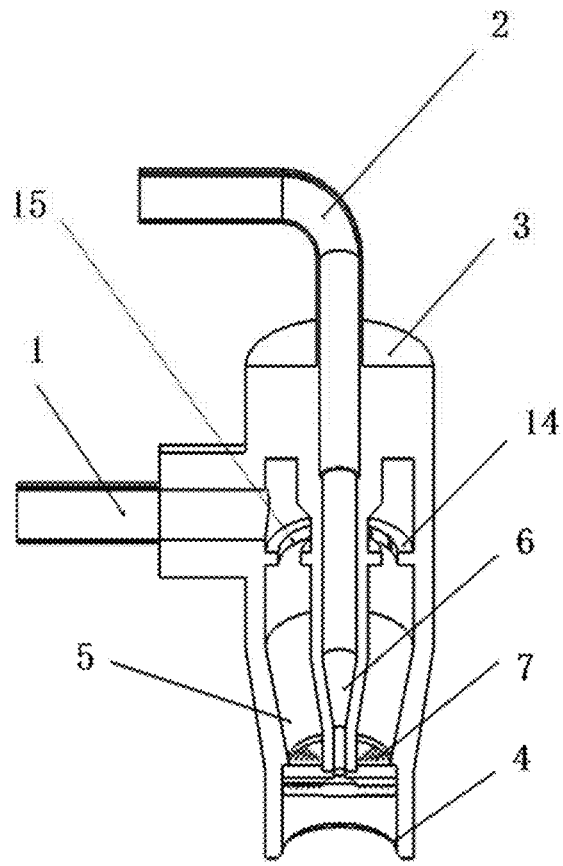
Figure 32:
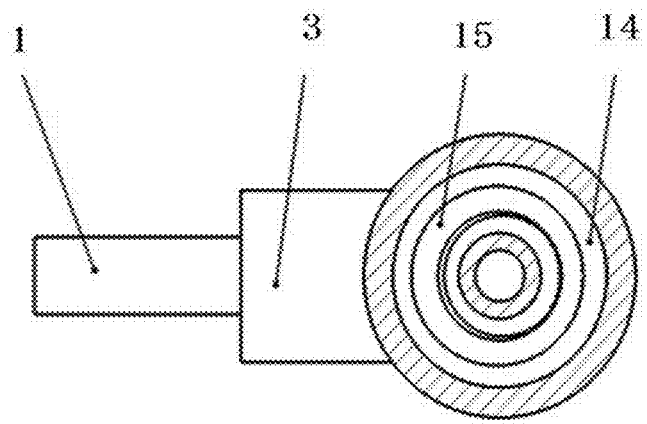

As shown in FIG. 31, an arc-shaped through hole 15 surrounding the liquid pipe 6 is manufactured on the gas separating plate 14 to adjust the gas flow. As shown in FIG. 32, the arc-shaped through hole 15 is manufactured with its opening gradually decreasing along the direction away from the gas inlet (from left to right as shown in the figure).

Figure 33:
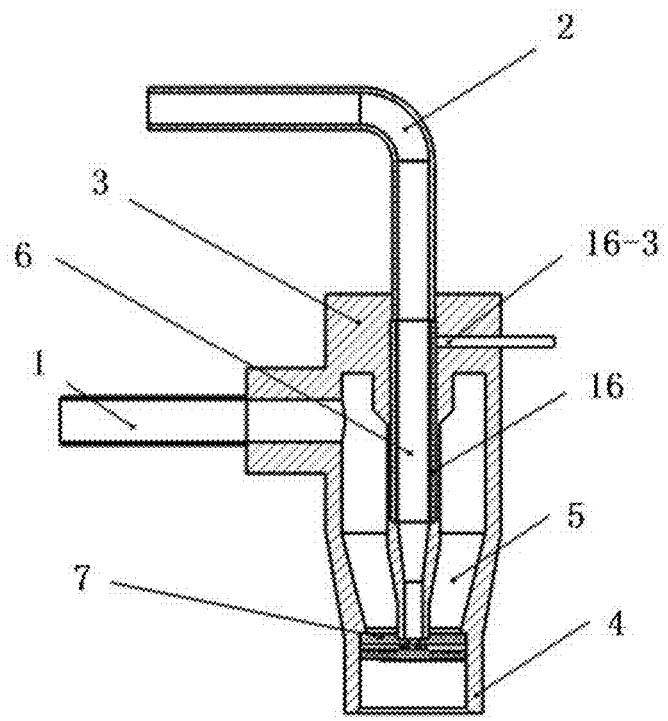

Referring now to FIG. 33, which is a schematic view illustrating a cleaning device having an ultrasonic or megasonic oscillation means in a preferred embodiment of the present invention, the cleaning device of the present invention further comprises an ultrasonic or megasonic generation unit 16 disposed along the inner surface of the liquid pipe 6. The ultrasonic or megasonic generation unit produces ultrasonic or megasonic oscillation and transfers the ultrasonic or megasonic energy into the flowing cleaning liquid, so as to bring the ultrasonic or megasonic energy to the atomized particles which are formed below the liquid-gas guiding part 7 by the collision of the liquid sprayed from the liquid guiding outlets and the gas sprayed from the gas guiding outlets. The atomized particle with the ultrasonic or megasonic energy are sprayed downward to the wafer surface under the vertical orientation effect of the atomized particle guiding outlet 4 with a vertical inner wall or under the acceleration effect of the atomized particle guiding outlet with a Laval nozzle structure, thereby performing ultrasonic or megasonic cleaning.

Figure 34:
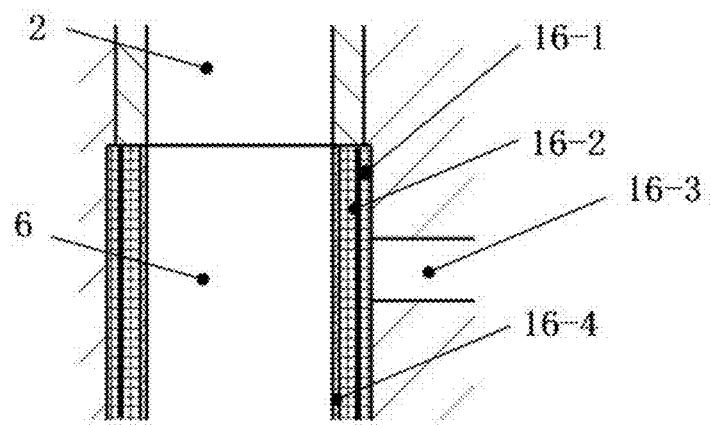

Referring now to FIG. 34, which is a fragmentary enlarged schematic view of the ultrasonic or megasonic generation unit in FIG. 33. As shown in FIG. 34, the ultrasonic or megasonic generation unit 16 comprises a piezoelectric material 16-1 and a coupling layer 16-2 which are connected sequentially along the direction toward the interior of the liquid pipe 6. The piezoelectric material 16-1 is connected to an external circuit via a terminal 16-3 to transfer the received electrical signal into the oscillation energy to produce high frequency oscillation, and transmits the resulting ultrasonic or megasonic oscillation energy to the coupling layer 16-2 and the cleaning liquid in the liquid pipe 6 sequentially.

Referring to FIG. 34 again, in a preferred embodiment, the piezoelectric material 16-1 and the coupling layer 16-2 are attached in a form of two nested annular structures, surrounding the inner wall of the liquid pipe 6. In other words, seen from one side of the vertical section of the ultrasonic or megasonic generation unit, the piezoelectric material 16-1 and the coupling layer 16-2 are attached sequentially along the direction toward the interior of the liquid pipe 6. The coupling layer 16-2 is exposed toward the interior of the liquid pipe at the same height with the inner wall of the liquid pipe so as not to affect the flow of the cleaning liquid.

Referring now to FIG. 34 again, in a further preferred embodiment, a corrosion resistant layer 16-4, such as fluorine plastic or polyester material and so on, is coated on the surface of the coupling layer 16-2 to prevent the coupling layer 16-2 and the piezoelectric material 16-1 from being corroded by the cleaning liquid to cause pollution. Preferably, the corrosion resistant layer 16-4 has a thickness ranges from 1 to 100 micron, and has a same height with the inner wall of the liquid pipe.

Figure 35:
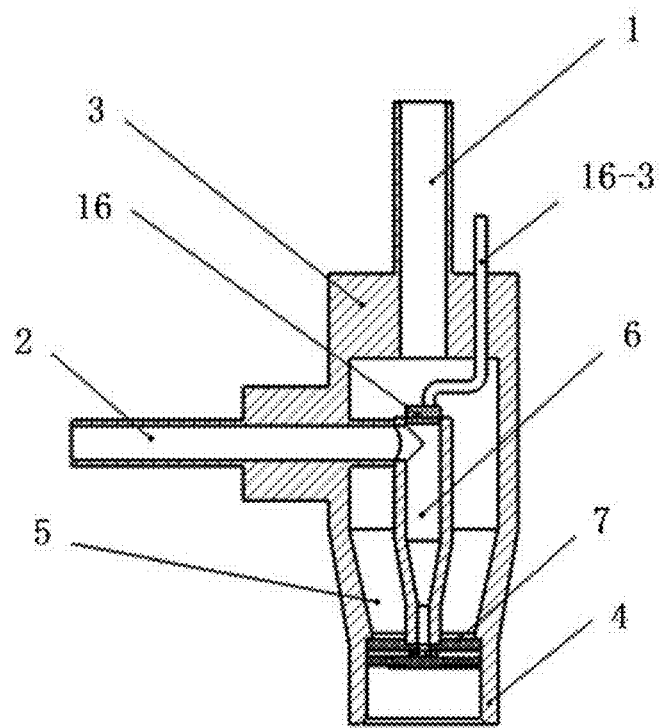

Referring now to FIG. 35, which is a schematic view illustrating a cleaning device having an ultrasonic or megasonic oscillation means in another preferred embodiment of the present invention. As shown in FIG. 35, the liquid intake pipeline 2 is introduced into the interior of the nozzle 3 from the upper sidewall of the nozzle 3 to be communicated with the liquid pipe 6, and the gas supply pipeline 1 is introduced into the interior of the nozzle 3 from the center area of the upper end surface of the nozzle 3 to be communicated with the gas pipe 5. Alternatively, the ultrasonic or megasonic generation unit 16 can also be arranged on the upper portion of the inner wall of the liquid pipe 6.

Figure 36:
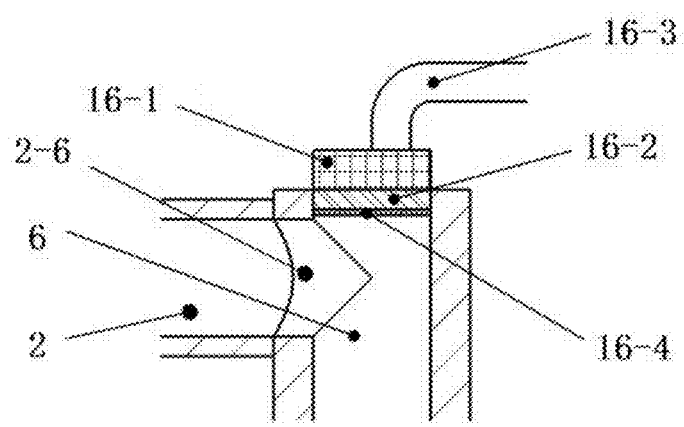

Referring now to FIG. 36, which is a fragmentary enlarged schematic view of the ultrasonic or megasonic generation unit in FIG. 35. As shown in FIG. 36, the ultrasonic or megasonic generation unit 16 also comprises the piezoelectric material 16-1 and the coupling layer 16-2, wherein, the piezoelectric material 16-1 and the coupling layer 16-2 are attached in a form of two sheets in a direction downward and toward the interior of the liquid pipe 6. The connection interface of the liquid intake pipeline 2 and the liquid pipe 6 is disposed below the side part of the ultrasonic or megasonic generation unit. The piezoelectric material 16-1 and the coupling layer 16-2 can have an arc-shaped surface coinciding with the inner wall of the liquid pipe 6. The piezoelectric material 16-1 is connected to an external circuit via a terminal to transfer the received electrical signal into the oscillation energy to produce high frequency oscillation and then transmits the resulting ultrasonic or megasonic oscillation energy to the coupling layer and the cleaning liquid in the liquid pipe sequentially. The surface of the coupling layer 16-2 can also be coated by a corrosion resistant layer 16-4 preferably having a thickness in the range from 1 to 100 micron and a same height with the inner wall of the liquid pipe.

Figure 37:
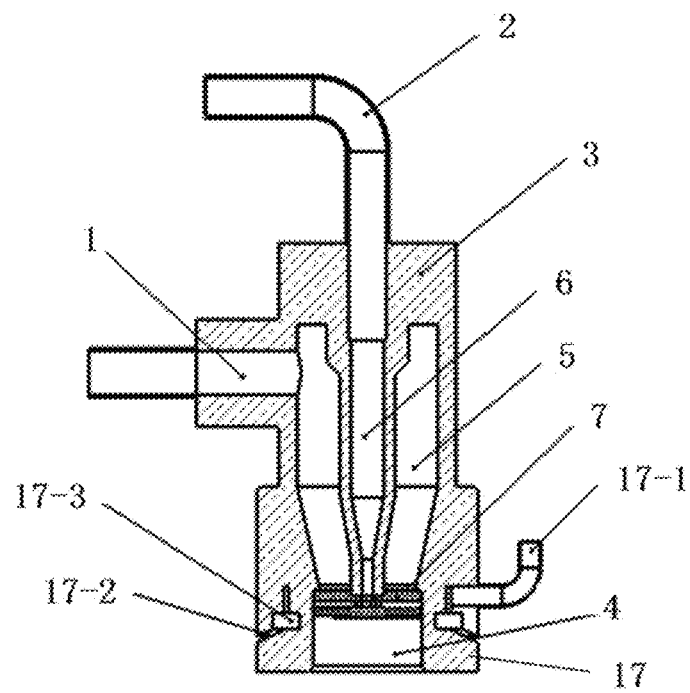

Referring now to FIG. 37, which is a schematic view illustrating a cleaning device having a gas shielding unit in a preferred embodiment of the present invention. As shown in FIG. 37, the cleaning device of the present invention further comprises a gas shielding unit 17 disposed around the lower end of the nozzle, which comprises shielding gas outlets 17-2 surrounding the atomized particle guiding outlet 4 and inclined downward and outward. During the cleaning process, a shielding gas is sprayed from the shielding gas outlets 17-2 at an inclined angle, and forms a gas shielding layer above the wafer to isolate the wafer from the air in the chamber, so that can prevent the reaction between the silicon element on the wafer and the oxygen in the chamber. During the drying process, the liquid intake pipeline 2 is turned off, a drying gas is sprayed from the atomized particle guiding outlet 4 and the shielding gas is sprayed from the shielding gas outlets 17-2 to commonly perform a fast drying for the entire wafer surface.

Figure 38:
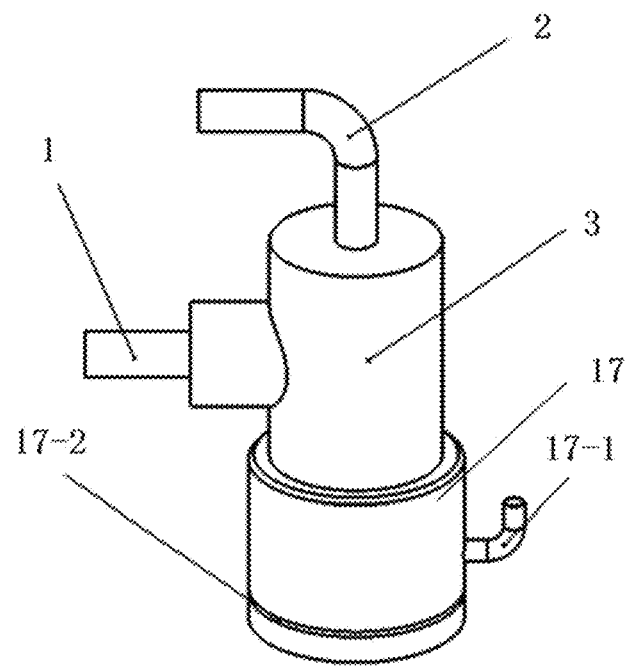

In order to form a circle of uniform gas shielding layer around the atomized particle guiding outlet 4, the shielding gas outlets 17-2 are horizontally and uniformly arranged in a circle. FIG. 38 is a schematic view of the outline structure of the cleaning device in FIG. 37. As shown in FIG. 38, the nozzle 3 has a round cross section, the liquid intake pipeline 2 is introduced into the interior of the nozzle from the center area of the upper end surface of the nozzle to be communicated with the liquid pipe, the gas supply pipeline 1 is introduced into the interior of the nozzle from the upper sidewall of the nozzle to be communicated with the gas pipe. The gas shielding unit 17 is structured like a barrel with a round cross section, and disposed around the lower end of the nozzle with its upper end tightly attached to the nozzle and its lower end opened. In a different embodiment, the shielding gas outlets 17-2 are also structured to form a circle of continuous air gap.

Referring now to FIG. 38, the gas shielding unit 17 further comprises a shielding gas inlet 17-1, which is formed at the side wall of the gas shielding unit for communicating the shielding gas outlet 17-2. The shielding gas can be fed from the shielding gas inlet 17-1 to the shielding gas outlet 17-2.

Referring now to FIG. 37, the gas shielding unit 17 further comprises a shielding gas buffer chamber which is arranged surrounding the atomized particle guiding outlet with one end communicating the shielding gas outlet 17-2 and the other end communicating the shielding gas inlet 17-1. The shielding gas buffer chamber is used to buffer the shielding gas fed from the shielding gas inlet to achieve a uniform distribution of the shielding gas along the circumferential direction and a same pressure of the shielding gas when sprayed out from the shielding gas outlet. There can be only one shielding gas inlet 17-1 arranged on the side wall of the gas shielding unit (as shown in FIG. 37), or there can be multiple shielding gas inlets 17-1 uniformly arranged along the circumference of the gas shielding unit to further achieve the uniform distribution of the shielding gas along the circumferential direction.

In a preferred embodiment, the shielding gas outlet 17-2 is disposed inclined toward the peripheral edge of the wafer. Preferably, the shielding gas outlet is inclined toward a position at a distance of 1~5 cm from the peripheral edge of the wafer. The inclined angle of the shielding gas outlet can be adjusted according to the diameter of the wafer to be cleaned.

Referring now to FIG. 39, which is a schematic view illustrating a cleaning device having a self-cleaning unit in a preferred embodiment of the present invention. As shown in FIG. 39, the cleaning device of the present invention further comprises a self-cleaning unit 18 arranged surrounding the lower end of the nozzle, which comprises a cleaning medium outlet 18-2 surrounding the atomized particle guiding outlet 4 and inclined downward and inward. During the cleaning process, a cleaning gas is obliquely sprayed from the cleaning medium outlet 18-2 toward the lower end of the atomized particle guiding outlet 4 to perform an online cleaning for the lower end of the atomized particle guiding outlet 4. Furthermore, the high speed cleaning gas also assists to bring the cleaning liquid flowed downward along the side wall of the atomized particle guiding outlet back to a position right below the atomized particle guiding outlet to be atomized again by the atomized particles, which prevents large condensed droplets of the atomized cleaning liquid forming on the side wall of the atomized particle guiding outlet and then dropping onto the wafer surface to cause problems such as defects on the wafer surface or non-uniform cleaning. After the cleaning process for the wafer, the nozzle is driven back to its initial position by the spray arm, and then a gas or a liquid or their atomized mixture is obliquely sprayed out from the cleaning medium outlet 18-2 to perform an offline cleaning for the lower end of the atomized particle guiding outlet 4. In order to form a circle of uniform high-pressure air flow around the atomized particle guiding outlet, the cleaning medium outlet 18-2 can be structured as a circle of horizontal continuous air gap. Alternatively, the cleaning medium outlet 18-2 can also be structured as a circle of horizontal and uniformly distributed gas holes.

Referring now to FIG. 40, which is a schematic view illustrating the outline structure of the cleaning device shown in FIG. 39. As shown in FIG. 40, the nozzle 3 has a round cross section, the liquid intake pipeline 2 is introduced into the interior of the nozzle from the center area of the upper end surface of the nozzle to be communicated with the liquid pipe, and the gas supply pipeline 1 is introduced into the interior of the nozzle from the upper sidewall of the nozzle to be communicated with the gas pipe. The self-cleaning part 18 is structured like an inverted cone with a round cross section, and disposed surrounding the lower end of the nozzle with its upper end tightly attached to the nozzle and its lower end which forms the cleaning medium outlet 18-2 opened.

Referring now to FIG. 40 again, the self-cleaning unit further comprises a cleaning medium inlet 18-3 which is formed on the upper surface of the cone-shaped self-cleaning unit, for communicating the cleaning medium outlet 18-2. The cleaning medium can be fed from the cleaning medium inlet 18-3 to the cleaning medium outlet 18-2.

Referring now to FIG. 41, which is a fragmentary enlarged schematic view of the self-cleaning unit shown in FIG. 39. As shown in FIG. 41, the self-cleaning unit further comprises a cleaning medium buffer chamber which is arranged surrounding the atomized particle guiding outlet with the lower end communicating the cleaning medium outlet 18-2 and the upper end communicating the cleaning medium inlet 18-3. The cleaning medium buffer chamber is used to buffer the cleaning medium fed from the cleaning medium inlet to achieve a uniform distribution of the cleaning medium along the circumferential direction and a same pressure of the cleaning medium sprayed out from the cleaning medium outlet. There can be only one cleaning medium inlet 18-3 arranged on the side wall of the self-cleaning unit, or there can be multiple cleaning medium inlets 18-3 uniformly arranged along the circumference of the self-cleaning unit to further achieve the uniform distribution of the cleaning medium along the circumferential direction.

Referring now to FIG. 41, in a preferred embodiment, the self-cleaning unit 18 is processed to have a shape of an inverted cone with the diameter of the cleaning medium buffer chamber 18-1 decreasing toward the cleaning medium outlet 18-2, that is, with a gradually reducing cross section of the chamber. Such structure speeds up the cleaning medium at the cleaning medium outlet.

Referring now to FIG. 41, in a preferred embodiment, the cleaning medium outlet 18-2 is disposed inclined toward the interior of the atomized particle guiding outlet 4 preferably at an angle from 5° to 60°. Furthermore, in order to better bring the cleaning liquid flowed downward along the side wall of the atomized particle guiding outlet back to the position right below the atomized particle guiding outlet by the high speed gas, the lower end surface 18-4 of the cleaning medium outlet 18-2 is disposed lower than the lower end surface 4-2 of the atomized particle guiding outlet 4 by a height difference indicated by H as shown in FIG. 41. Preferably, the height difference H mentioned above ranges from 0.5 to 3 mm.

The present invention also provides a cleaning device that permits the adjustment of the spay direction, by which the peripheral edge of the wafer can also be completely rinsed during the general cleaning process so as to improve the yield rate of the chip manufacturing. Referring now to FIGS. 42~43, which are schematic views illustrating a cleaning device with a spray direction adjustment means in a preferred embodiment of the present invention. As shown in FIG. 42, based on the cleaning device of the present invention mentioned above, a rotating unit such as a rotary buckle 19 matched with the nozzle 3 is disposed outside the nozzle 3 to rotate the nozzle 3 within the rotary buckle 19. Moreover, a vertical shielding cover 20 is provided outside the nozzle on one side along the rotating direction. For example, an arc-shaped shielding cover 20 having a shielding surface of a certain width is equipped at the bottom of the rotary buckle 19 extending in a vertical downward direction. As shown in FIG. 43, the nozzle 3 is manufactured to have a spherical structure, the rotary buckle 19 comprises two parts vertically joined together and an internal chamber matched with the spherical structure of the nozzle to be engaged with the spherical structure, so as to enable a relative rotation between the nozzle 3 and the rotary buckle 19.

During the cleaning process, the wafer is fixed on the spin chuck in the cleaning chamber and rotated at a certain speed, the nozzle is rotated to be inclined at a certain angle with respect to the wafer surface toward the direction away from the center of the wafer, and aimed to clean the peripheral edge of the wafer. Most of the splashed cleaning liquid will fly toward the out-of-wafer regions, while a small amount of the cleaning liquid flying to the wafer center will impact on the shielding cover 20 and drop downward to the wafer surface to be spun out from the wafer by the centrifugal force of the rotating wafer, so that can prevent the secondary pollution to the wafer center. The rotation angle of the nozzle 3 relative to the wafer surface can be adjusted by manual, or by a transmission or a motor equipped above the nozzle.

Referring now to the FIGS. 44~45, which are schematic views illustrating the cleaning device positioned in the cleaning chamber in a preferred embodiment of the present invention. As shown in FIG. 44, a spin chuck 26 is positioned in the cleaning chamber 27 and driven by a motor 25 to rotate, on which clamping elements 23 are provided to fix the wafer 28. A waste liquid recovery unit is provided below the cleaning chamber 27 for collecting the waste liquid that discharged from a waste liquid outlet 24 at the bottom of the cleaning chamber. The nozzle 3 of the cleaning device is hung in the cleaning chamber 27 capable of moving across and above the spin chuck. The nozzle 3 can be connected and fixed on the spray arm through the intake supply pipeline 2 and the gas intake pipeline 1.

Referring now to FIG. 44, the cleaning device of the present invention further comprises a mass flow liquid pipe 22 positioned in the cleaning chamber 27 in a diagonal upper direction with respect to the spin chuck 26. For example, the mass flow liquid pipe 22 is disposed on the upper portion of the inner wall of the cleaning chamber 27 with an outlet facing toward the center of the spin chuck.

During the two-phase cleaning process, in addition that the liquid intake pipeline and the liquid pipe within the nozzle introduce a cleaning liquid flow, there also needs another liquid pipe that introduces a cleaning liquid of high flow to form a uniform cleaning liquid membrane completely covering the surface of the wafer 28. This is because that the atomized particles generated by the nozzle alone may not be sufficient to cover the entire area of the wafer to achieve an optimal cleaning effect. By contrast, when the cleaning liquid membrane is formed on the wafer surface, the high speed atomized particles sprayed from the atomized particle guiding outlet will impact on the cleaning liquid membrane to generate an impact force and form a shock wave rapidly spreading in the cleaning liquid membrane. When the shock wave acts upon the contaminant particles, it accelerates the peeling of the contaminant particles from the wafer surface on one hand, and increases the flow speed of the cleaning liquid on the wafer surface to prompt a faster removal of the contaminant particles from the wafer surface along with the cleaning liquid flow on the other hand.

During the cleaning process, the spray arm 21 moves along a trajectory as shown in FIG. 46 to drive the nozzle 3 to perform an arc-shaped reciprocating motion passing through the center of the wafer 28, so as to clean the wafer on the spin chuck 26.

Referring now to FIG. 44, a large flow of cleaning liquid is introduced from a mass flow liquid inlet 22-2 of the mass flow liquid pipe 22 and sprayed out from a mass flow liquid outlet. The spray angle of the mass flow liquid can be adjusted by a spray angle adjustment unit 22-1 so as to spray the mass flow cleaning liquid to the wafer center. During the process, firstly the mass flow liquid pipe 22 is turned on to spray the cleaning liquid until the entire wafer surface is completely covered, then the nozzle is turned on to begin the two-phase flow cleaning process. Meanwhile the mass flow liquid pipe can be kept turned on, or turned off, or intermittently turned on, which depends on the processing parameters, such as the flow of the liquid intake pipeline and that of the mass flow liquid pipe, the rotation speed of the wafer, and so on.

Referring now to FIG. 45, the mass flow liquid pipe 22 can also be connected and fixed on the spray arm with its outlet positioned on one side of the nozzle 3 in a vertical downward direction. Compared with the structure shown in FIG. 44, the mass flow liquid pipe 22 fixed on the spray arm 21 can perform an arc-shaped swing synchronically with the nozzle 3.

In addition, in a further optimized design, a gas flow regulating valve for regulating gas flow can be provided on at least one of the gas intake pipeline, the shielding gas inlet, and the cleaning medium inlet; a liquid flow regulating valve for regulating liquid flow can be provided on the liquid intake pipeline. Wherein, the gas flow in the gas intake pipeline can be regulated between 10 L/min to 150 L/min, preferably between 60 L/min to 100 L/min; the liquid flow in the liquid intake pipeline can be regulated between 10 ml/min to 150 ml/min, preferably between 50 ml/min to 200 ml/min.

Furthermore, a flow regulating valve for regulating mass liquid flow can be provided on the mass flow liquid pipe. Wherein, the flow can be controlled between 100 ml/min to 2000 ml/min, preferably between 500 ml/min to 1000 ml/min.

Furthermore, a pneumatic valve for on-off control can be provided on at least one of the gas intake pipeline, the liquid intake pipeline, the shielding gas inlet, the cleaning medium inlet and the mass flow liquid pipe.

The formation mechanism of the atomized particles according to the cleaning device of the present invention is as follows. The cleaning liquid in the liquid intake pipeline is introduced into the multiple divergent liquid bypass pipelines through the liquid pipe of the nozzle, and then sprayed out from the liquid guiding outlets. Since the total area of the liquid guiding outlets is smaller than the sectional area of the liquid intake pipeline and that of the liquid pipe, the cleaning liquid is accelerated and cut into a plurality of liquid flows having diameters of micron scale and then sprayed out at a predetermined angle. Similarly, the gas in the gas intake pipeline is sprayed out from the gas guiding outlets at the bottom of the gas pipe along the direction of the vertical axis of the nozzle to form a plurality of gas flows with diameters of micron scale. The liquid flow collides with the gas flow below the liquid-gas guiding part to be crushed into accelerated ultra-micro atomized particles. Regarding to the atomized particle guiding outlet with a vertical inner wall, the ultra-micro atomized particles whose motion direction is non-parallel to the vertical axis of the nozzle will knock on the side wall of the atomized particle guiding outlet to be re-converged into large droplets flow downward along the side wall. Therefore, the motion direction of all the atomized particles sprayed from the atomized particle guiding outlet are consistent.

In addition, according to the cleaning device of the present invention that has the ultrasonic or megasonic generation unit, during the cleaning process, the cleaning liquid is introduced into and fills the liquid pipe in the nozzle from the liquid intake pipeline. The electrical signal inputted from the external circuit is transferred to the piezoelectric material through the terminal to form the high-frequency oscillation. The resulting ultrasonic or megasonic oscillation energy is transmitted to the coupling layer and the corrosion-resistant layer sequentially, and finally into the cleaning liquid. The cleaning liquid with the ultrasonic or megasonic energy sprayed out from the liquid guiding outlets of the gas-liquid guiding part collides with the high speed gas sprayed out from the gas guiding outlets to form the atomized particles with accelerated speed. The above atomized particles, which have possessed the ultrasonic or megasonic energy, are sprayed out from the atomized particle guiding outlet into the cleaning liquid membrane on the wafer surface to cause local oscillation and remove the contaminant particles.

According to the cleaning device of the present invention that has the gas shielding unit, the shielding gas inlet is turned on when the mass flow liquid pipe is opened. During the cleaning process, the shielding gas is sprayed out from the shielding gas outlet at an inclined angle and forms a gas shielding layer above the wafer to isolate the wafer from the air in the chamber. During the drying process, the liquid intake pipeline is turned off, and then the drying gas sprayed from the atomized particle guiding outlet and the shielding gas sprayed from the shielding gas outlet commonly perform a fast drying for the whole wafer surface.

According to the cleaning device of the present invention that has the self-cleaning unit, during the cleaning process, a gas which used as the cleaning medium is introduced from the cleaning medium inlet into the cleaning medium buffer chamber, and then achieves a uniform pressure distribution along the circumferential direction after passing through the cleaning medium buffer chamber. Finally, the gas is sprayed out from the cleaning medium outlet toward the interior of the atomized particle guiding outlet at an inclined angle, so as to perform the online cleaning. At the same time, the high speed cleaning medium of gas also assists to bring the cleaning liquid flowed downward along the side wall of the atomized particle guiding outlet back to a position right below the outlet of the nozzle to be atomized again by the atomized particles, so as to prevent large condensed droplets of the cleaning liquid forming and flowing down along the side wall of the atomized particle guiding outlet and then dropping onto the wafer surface to cause problems such as defects on the wafer surface or non-uniform cleaning. After the two-phase flow cleaning process, the spray arm is driven back to its initial position away from above the wafer. Then the cleaning medium inlet is turned on for introducing a gas or a liquid or their atomized mixture to perform the offline cleaning for the lower end of the atomized particle guiding outlet, so as to effectively avoid the formation of the condensed droplets of the remaining cleaning liquid at the atomized particle guiding outlet and provide a sufficient preparation for the next cleaning process.

According to the cleaning device of the present invention that permits the adjustment of the spray direction, during the cleaning process, the wafer is fixed on the spin chuck in the cleaning chamber and rotated at a certain speed. The nozzle is rotated to be inclined at a certain angle with respect to the wafer surface in the direction away from the center of the wafer toward the peripheral edge of the wafer to perform the cleaning. Most of the splashed cleaning liquid will fly toward the out-of-wafer regions, while a small amount of the cleaning liquid flying to the wafer center will impact on the shielding cover and drop downward to the wafer surface to be spun out by the centrifugal force of the rotating wafer, so that can prevent the secondary pollution to the wafer center.

The cleaning method using the cleaning device of the present invention will be described in detail in the following specific embodiments.

Firstly, setting the trajectory of the spray arm 21 and the cleaning process recipe, and starting the cleaning process.

Wherein, the wafer 28 is firstly fixed on the spin chuck 26 by fixation means (e. g., the clamping elements 23 as shown in FIGS. 44~45) and rotated at a certain speed driven by the motor 25.

Then, turning on the mass flow liquid pipe 22 and regulating the flow to spray a mass flow of the cleaning liquid toward the wafer surface so as to form a uniformly distributed cleaning liquid membrane.

Next, after a certain time period, preferably 3 s to 10 s, turning on the liquid intake pipeline 2 and regulating the flow to feed the cleaning liquid into the liquid pipe 6 of the nozzle 3. At the same time, opening the gas intake pipeline 1 and feeding a certain flow of gas into the gas pipe 5 of the nozzle 3. The liquid sprayed from the liquid guiding outlets is injected toward the gas sprayed from the gas guiding outlets to cause an atomization effect to form the ultra-micro atomized particles. The size of the atomized particles can be adjusted through regulating the flow of the liquid intake pipeline 2 and that of the gas intake pipeline 1.

The produced atomized particles, which are driven by the high speed gas and the vertical orientation effect of the vertical inner wall 4-1 of the atomized particles guiding outlet 4 or the acceleration effect of the Laval nozzle structure 8, are vertically spayed into the cleaning liquid membrane on the wafer surface to increase the physical force acting upon the contaminants and meanwhile cause the vibration of the cleaning liquid membrane, so as to speed up the transmission of the contaminants to the cleaning liquid, and improve the cleaning efficiency and cleaning effects.

In a preferred embodiment, flow control valves are provided to regulate the liquid flow of the mass flow liquid pipe 22 between 100 ml/min and 2000 ml/min, the liquid flow of the liquid intake pipeline 2 between 10 ml/min and 500 ml/min, and the gas flow of the gas intake pipeline 1 between 10 L/min and 150 L/min, so as to form the ultra-micro atomized particles with uniform size.

In a further preferred embodiment, the liquid flow of the mass flow liquid pipe 22 is controlled between 500 ml/min and 1000 ml/min, the liquid flow of the liquid intake pipeline 2 is controlled between 50 ml/min and 200 ml/min, and the gas flow of the gas intake pipeline 1 is controlled between 60 L/min and 100 L/min, so as to form the ultra-micro atomized particles with further uniform size.

In another preferred embodiment, the cleaning liquid introduced in the mass flow liquid pipe 22 and in the liquid intake pipeline 2 comprises a cleaning solution or ultra-pure water. Especially, the cleaning liquid introduced in the mass flow liquid pipe 22 and that in the liquid intake pipeline 2 can be the same or different. The specific cleaning liquid to be used can be selected according to the actual requirement.

In addition, the above cleaning method also comprises setting the operation frequency and the power of the ultrasonic or megasonic generation unit 16 before the cleaning process, and turning on the ultrasonic or megasonic generation unit while opening the liquid intake pipeline and the gas intake pipeline. The received electrical signal is converted into the oscillation energy through the piezoelectric material 16-1 and forms the high-frequency oscillation, and then the resulting ultrasonic or megasonic oscillation energy is transmitted to the coupling layer 16-2 and the cleaning liquid in the liquid pipe in turn to bring the ultrasonic or megasonic energy to the atomized particles which are formed below the gas-liquid guiding part due to the collision of the cleaning liquid sprayed from the liquid guiding outlets and the gas sprayed from the gas guiding outlets. The atomized particles with the ultrasonic or megasonic energy are sprayed into the cleaning liquid membrane on the wafer surface under the vertical orientation effect of the vertical side wall structure of the atomized particle guiding outlet 4 or the acceleration effect of the Laval nozzle structure of the atomized particle guiding outlet 4, which forms a local oscillation and increases the physical force acting upon the contaminants, and meanwhile also causes the vibration of the cleaning liquid membrane and speeds up the transmission of the contaminants toward the cleaning liquid, thereby achieving the ultrasonic or megasonic cleaning and improving the cleaning efficiency.

The above cleaning method further comprises: at the beginning of the cleaning process, while opening the mass flow liquid pipe, turning on the shielding gas inlet 17-1 of the gas shielding unit 17 for introducing a certain flow of shielding gas and obliquely spraying out the shielding gas from the shielding gas outlet 17-2 to form a gas shielding layer above the wafer to isolate the wafer from the air, so as to perform the reciprocating cleaning process to the wafer under the protection of the shielding gas. During the subsequent drying process, turning off the liquid intake pipeline while keeping the gas intake pipeline 1 and the shielding gas inlet 17-1 opened for introducing a certain flow drying gas into the gas pipe 5 and a certain flow shielding gas into the shielding gas buffer chamber 17-3 and the shielding gas outlet 17-2. As a result, the drying gas vertically sprayed out from the atomized particle guiding outlet 4 and the shielding gas obliquely sprayed out from the shielding gas outlet 17-2 cover the whole wafer surface and commonly perform the fast drying for the wafer.

When the shielding gas is applied, the cleaning liquid introduced into the mass flow liquid pipe and the liquid intake pipeline may comprise chemical solutions such as DHF or ultra-pure water, and the gas introduced into the gas intake pipeline and the shielding gas inlet may comprise nitrogen, argon or carbon dioxide. Especially, the cleaning liquid introduced into the mass liquid pipe and that introduced into the liquid intake pipeline can be the same or different; the gas introduced into the gas intake pipeline and that introduced into the shielding gas inlet can be the same or different. The specific cleaning liquid or gas to be used can be selected according to the actual requirement.

In addition, in another preferred embodiment, during the cleaning and drying process, the shielding gas is sprayed out in a direction toward the periphery edge of the wafer, preferably toward a position at a distance of 1~5 cm from the periphery edge of the wafer. The spray direction and the flow of the shielding gas can be adjusted according to the diameter of the wafer to be cleaned.

During the drying process, the cleaning device (the nozzle) can be fixed above the wafer center by the spray arm 21 to statically spray the drying gas and the shielding gas; or the cleaning device (the nozzle) can perform an arc-shaped reciprocating motion across the wafer center driven by the spray arm while spraying the drying gas and the shielding gas.

The above cleaning method further comprises: while opening the liquid intake pipeline and the gas intake pipeline, turning on the cleaning medium inlet 18-3 of the self-cleaning unit for introducing a certain flow of gas as the cleaning medium and spraying the gas from the cleaning medium outlet 18-2 at an inclined angle such as 5° to 60° toward the interior of the atomized particle guiding outlet 4, so as to perform the online cleaning for the lower end of the atomized particle guiding outlet 4. At the same time, the high speed cleaning medium of gas also assists to bring the cleaning liquid flowed downward along the side wall of the atomized particle guiding outlet back to a position right below the outlet of the nozzle to be atomized again by the atomized particles, so as to be re-used for the cleaning process and prevent formation of the cleaning liquid droplets. After the cleaning process, the spray arm 21 is driven back to its initial position away from above the wafer, and a gas or a liquid or their atomized mixture is introduced into the cleaning medium inlet 18-3 and then sprayed out from the cleaning medium outlet 18-2 toward the interior of the atomized particle guiding outlet at an inclined angle, e. g., 5° to 60°, to perform the offline cleaning for the lower end of the atomized particle guiding outlet 4.

During cleaning the nozzle, in a preferred embodiment, the cleaning liquid introduced into the mass flow liquid pipe and the liquid intake pipeline may comprise a cleaning solution or ultra-pure water, the gas introduced into the gas intake pipeline and the cleaning medium inlet may comprise nitrogen, carbon dioxide or compressed air, the liquid cleaning medium introduced into the cleaning medium inlet may comprise ultra-pure water or other cleaning solutions. Especially, the cleaning liquid introduced into the mass flow liquid pipe and that introduced into the liquid intake pipeline can be the same or different, and the gas introduced into the gas intake pipeline and that introduced into the cleaning medium inlet can be the same or different. The specific gas or liquid to be used can be selected according to the actual requirement.

The above cleaning method further comprises, during the cleaning process when the wafer is fixed on the spin chuck in the cleaning chamber and rotated at a certain speed, rotating the nozzle to be inclined at a certain angle with respect to the wafer surface in the direction away from the center of the wafer toward the peripheral edge of the wafer, thus to effectively remove the contaminants on the peripheral edge of wafer and improve the chip manufacturing yield rate. At the same time, the splashed cleaning liquid is resisted by the shielding cover and drops downward to the wafer surface to be spun out by the centrifugal force of the rotating wafer, so that can prevent the secondary pollution to the wafer center.

In summary, the present invention has the following notable features:

1. With the nozzle structure having the liquid guiding outlets and the gas guiding outlets which enable a sufficient collision of the high speed liquid and the high speed gas sprayed out therefrom, and further with the flow control of the pipelines of the nozzle, ultra-micro atomized particles having uniform and adjustable size can be formed. Since the size and the energy of the atomized particles are greatly reduced, the damage to the pattern structures on the wafer surface can be prevented. Furthermore, the atomized particle guiding outlet can be a Laval nozzle structure to spray out the atomized particles with higher speed while keeping the flow of the gas intake pipeline and the flow of the liquid intake pipeline constant, thereby improving the cleaning efficiency.

2. In the case where the atomized particle guiding outlet has an vertical inner wall, the atomized flow can be sprayed out in a direction vertical to the wafer surface under the vertical orientation effect of the atomized particle guiding outlet during the cleaning process, which promotes the transmission of the contaminants within the trenches of the patterns on the wafer surface into the cleaning liquid fluid, improves the cleaning quality and efficiency, reduces the transverse shear force of the atomized particles to the patterns on the wafer surface and avoids the damage to the patterns.

3. During the cleaning process, a cleaning liquid with high flow can be sprayed from a mass flow liquid pipe to pre-form a cleaning liquid membrane on the wafer surface before the injection of the atomized particles with uniform adjustable size and small mass to rinse the wafer surface. Therefore, the impact force from the atomized particles to the patterns of the wafer surface can be reduced, and the damage to the patterns can be decreased. Furthermore, the atomized particles hitting against the cleaning liquid membrane forms a shock wave which on one hand acts on the contaminated particles to speed up the peeling of the contaminants from the wafer surface, on the other hand accelerates the flow of the cleaning liquid on the wafer surface to promote the rapid removal of the contaminants from the wafer surface along with the cleaning liquid flow.

4. The liquid-gas guiding part with spiral-shaped liquid/gas guiding outlets can improve the atomization efficiency of the cleaning liquid, reduce the diameter of the atomized particles, and improve the uniformity of the atomized particles; while the liquid-gas guiding part with Laval-nozzle structured liquid/gas guiding outlets can increase the speed of the liquid/gas sprayed therefrom.

5. The shape of the nozzle can be a sector, a triangle, a polygon or a bar to enhance the coverage area of the nozzle, that is, to increase the area cleaned by the nozzle at one time, thereby improving the cleaning uniformity and the cleaning efficiency.

6. A gas separating plate can be provided in the gas intake pipeline to achieve a uniform gas flow distribution, and improve the size and amount distribution uniformity of the atomized particles.
7. The cleaning liquid with the ultrasonic or megasonic energy can be atomized by the cleaning device to form the atomized particles. Since these atomized particles are randomly distributed into the cleaning liquid membrane on the wafer surface both in time and in space, the ultrasonic or megasonic energy carried by the atomized particles will not generate a stable energy interference field. In other words, the uniformity of the ultrasonic or megasonic energy applied to the wafer surface is improved, so as to effectively suppress the damage to the patterns on the wafer surface.
8. Compared with the conventional cleaning device, the cleaning device of the present invention with the ultrasonic or megasonic oscillation means can spray the atomized particles with ultrasonic or megasonic energy into the cleaning liquid membrane on the wafer surface. Accordingly, in addition that the atomized particles injected to the wafer surface with the kinetic energy forms a shock wave in the liquid membrane, the ultrasonic or megasonic energy is also carried into the liquid membrane by the atomized particles to form a shock wave due to the collapse of cavitation bubbles or a straight flow, thus to improve the efficiency of removing the contaminants on the wafer surface, shorten the process time, save the usage of the cleaning liquid and the high-purity gas, reduce the production cost, and decrease the influence for the environment.
9. In the two-phase flow cleaning process, a shielding gas can be sprayed out from the shielding gas outlet at an inclined angle and forms a gas shielding layer above the wafer, which prevents the reaction between the silicon element on the wafer surface and the oxygen in the cleaning chamber. In the drying process, the liquid intake pipeline can be turned off while keeping the gas intake pipeline and the shielding gas outlet both opened to replace the conventional single spray arm which injects a drying gas individually, so as to perform a rapid drying process to the entire wafer surface including the center area and the peripheral edge and simplify the structure of the cleaning chamber.
10. In the two-phase flow cleaning process, a gas as the cleaning medium can be introduced into a cleaning medium buffer chamber through the cleaning medium inlet and achieve a uniform pressure distribution along the circumferential direction after passing through the cleaning medium buffer chamber. Then the gas can be sprayed out from the cleaning medium outlet toward the interior of the atomized particle guiding outlet at an inclined angle. Therefore, in addition to perform an online cleaning of the nozzle, the high speed cleaning medium of gas can also assist to bring the cleaning liquid flowed downward along the side wall of the atomized particle guiding outlet back to a position right below the outlet of the nozzle to be atomized again by the atomized particles, which prevents large condensed droplets of the cleaning liquid forming on the side wall of the atomized particle guiding outlet and then dropping onto the wafer surface to cause the problems such as defects on the wafer surface or non-uniform cleaning. After the two-phase flow cleaning process, the spray arm can be moved back to its initial position, away from above the wafer, and then the cleaning medium inlet can be turned on for introducing a gas or a liquid or their atomized mixture to perform an offline cleaning for the lower end of the atomized particle guiding outlet. Accordingly, the formation of the condensed droplets of the remaining cleaning liquid at the atomized particle guiding outlet can be prevented, which provides a necessary preparation for the next cleaning process. Therefore, by employing the self-cleaning unit, the present invention can ensure an in-time cleaning for the nozzle both during and after the cleaning process.
11. The rotating unit and the shielding cover can be provided outside the nozzle, which not only enables the nozzle to be inclined with respect to the wafer surface toward a direction away from the center of the wafer to perform cleaning to the peripheral edge of the wafer and effectively remove the contaminants on the peripheral edge, but also prevents the secondary pollution caused by the splash of the cleaning liquid.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:
1. A cleaning device for atomizing and spraying liquid in two-phase flow for cleaning a wafer positioned on a spin chuck in a cleaning chamber, comprising a nozzle, a liquid intake pipeline, a gas intake pipeline and an atomized particle guiding outlet; wherein;
 the nozzle includes:
  a liquid pipe inside the nozzle;
  a gas pipe surrounding the liquid pipe;
  a liquid-gas guiding part disposed at a lower end of the nozzle and provided with multiple liquid bypass pipelines which are connected with the liquid pipe, wherein the liquid bypass pipelines are symmetric with respect to the center of the liquid-gas guiding part;
  an exhaust mesh plate disposed adjacent to the liquid bypass pipelines and connected with the gas pipe; wherein each portion of the exhaust mesh plate arranged between each two adjacent liquid bypass pipelines is provided with a plurality of gas guiding outlets oriented in a direction perpendicular to the exhaust mesh plate, and each liquid bypass pipeline is provided with a surface having liquid guiding outlets formed along its length; wherein the surface is disposed below the exhaust mesh plate and inclined in a downward direction with respect to the exhaust mesh plate at a predetermined angle from 10 degrees to 80 degrees;
  wherein the liquid guiding outlets and/or the gas guiding outlets are straight tubular shaped, spiral tubular shaped or Laval nozzle structured;
 wherein, the liquid intake pipeline and the gas intake pipeline are both connected to a spray arm and respectively communicated with the liquid pipe and the gas pipe inside the nozzle; wherein, the spray arm drives the nozzle to perform an arc-shaped reciprocating motion passing through the center of the wafer;
 wherein, the atomized particle guiding outlet is disposed around and below the liquid-gas guide part; the atom- ized particle guiding outlet has a Laval nozzle structure or an inner wall oriented in the direction perpendicular to the exhaust mesh plate;

wherein, a liquid sprayed from the liquid guiding outlets and a gas sprayed from the gas guiding outlets collide against each other below the liquid-gas guiding part to form atomized particles which are then sprayed downward to the wafer surface through the atomized particle guiding outlet to perform a reciprocating two-phase flow cleaning process.

2. The cleaning device according to claim 1, wherein the gas intake pipeline is introduced into the nozzle from an upper side wall of the nozzle to be communicated with the gas pipe; a gas separating plate is horizontally disposed in the gas pipe below a gas inlet of the gas pipe and around the liquid pipe, on which a series of through holes with different sizes surrounding the liquid pipe are formed in a way that diameters of the holes decrease gradually along a direction away from the gas inlet of the gas pipe.

3. The cleaning device according to claim 1, wherein the gas intake pipeline is introduced into the nozzle from an upper side wall of the nozzle to be communicated with the gas pipe; a gas separating plate is horizontally disposed in the gas pipe below a gas inlet of the gas pipe and around the liquid pipe, on which an arc-shaped through hole surrounding the liquid pipe is formed in a way that an opening of the through hole gradually decreases along a direction away from the gas inlet of the gas pipe.

* * * * *